United States Patent
Kim

(10) Patent No.: US 8,434,910 B2
(45) Date of Patent: May 7, 2013

(54) LIGHT EMITTING DEVICE PACKAGE AND LIGHTING SYSTEM

(75) Inventor: Choong Youl Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/115,291

(22) Filed: May 25, 2011

(65) Prior Publication Data

US 2011/0222280 A1  Sep. 15, 2011

(30) Foreign Application Priority Data

Jun. 1, 2010  (KR) .................. 10-2010-0051998

(51) Int. Cl.
*F21V 5/04* (2006.01)

(52) U.S. Cl.
USPC ........ 362/311.02; 362/268; 362/84; 362/309; 362/245; 257/98

(58) Field of Classification Search .............. 362/84, 362/23, 230, 237, 244, 307–309, 311.02, 362/311.09, 311.1, 268, 235, 243, 245, 246, 362/327, 335, 336; 257/79, 98, 99, 100, 257/103

See application file for complete search history.

(56) References Cited

U.S. PATENT DOCUMENTS

| | | | | |
|---|---|---|---|---|
| 6,773,139 B2 * | 8/2004 | Sommers | ...................... | 362/237 |
| 7,182,481 B2 * | 2/2007 | Shimura | ...................... | 362/244 |
| 7,726,856 B2 * | 6/2010 | Tsutsumi | ...................... | 362/510 |
| 7,897,980 B2 | 3/2011 | Yuan et al. | ...................... | 257/88 |
| 7,959,328 B2 * | 6/2011 | Wanninger | ...................... | 362/309 |
| 7,963,668 B2 * | 6/2011 | Yin et al. | ...................... | 362/244 |
| 8,075,165 B2 * | 12/2011 | Jiang et al. | ...................... | 362/308 |
| 2003/0161137 A1 * | 8/2003 | Schach et al. | ...................... | 362/29 |
| 2003/0235050 A1 * | 12/2003 | West et al. | ...................... | 362/327 |
| 2004/0208020 A1 * | 10/2004 | Ishida | ...................... | 362/545 |
| 2006/0164838 A1 * | 7/2006 | Park et al. | ...................... | 362/309 |
| 2007/0102718 A1 | 5/2007 | Takeuma et al. | ...................... | 257/98 |
| 2008/0170396 A1 | 7/2008 | Yuan et al. | ...................... | 362/244 |
| 2009/0273727 A1 * | 11/2009 | Kubota et al. | ...................... | 349/62 |
| 2010/0165600 A1 * | 7/2010 | Ku | ...................... | 362/84 |
| 2010/0237370 A1 * | 9/2010 | Kim et al. | ...................... | 257/98 |
| 2011/0069496 A1 * | 3/2011 | Ing et al. | ...................... | 362/311.02 |
| 2011/0101385 A1 * | 5/2011 | Medendorp, Jr. | ...................... | 257/88 |

FOREIGN PATENT DOCUMENTS

| | | | |
|---|---|---|---|
| JP | 2006-120748 A1 | | 5/2006 |
| JP | 2007-134704 A | | 5/2007 |
| JP | 2009-111346 A | | 5/2009 |
| KR | 10-2006-0031446 A | | 4/2006 |

(Continued)

OTHER PUBLICATIONS

Korean Office Action dated Apr. 6, 2011 issued in Application No. 10-2010-0051998.

*Primary Examiner* — Bao Q Truong
(74) *Attorney, Agent, or Firm* — KED & Associates, LLP

(57) ABSTRACT

Disclosed are a light emitting device package and a lighting system. The light emitting device package includes a body including a recess and a plurality of light emitting device receiving parts formed in a bottom surface of the recess, a plurality of light emitting devices separately provided in the light emitting device receiving parts, a plurality of individual lenses spaced apart from each other on the light emitting device receiving parts, and a common lens covering the individual lenses, wherein at least one of the plurality of individual lenses comprises a concave part formed at the upper portion of the individual lens.

20 Claims, 27 Drawing Sheets

FOREIGN PATENT DOCUMENTS

| | | |
|---|---|---|
| KR | 10-2006-0040923 A | 5/2006 |
| KR | 10-2006-0104432 A | 10/2006 |
| KR | 10-2008-0022972 A | 3/2008 |
| KR | 10-2009-0005194 A | 1/2009 |
| KR | 10-2009-0026689 A | 3/2009 |
| KR | 10-2009-0132920 A | 12/2009 |
| KR | 10-2010-0003338 A | 1/2010 |
| WO | WO 2007/121486 A2 | 10/2007 |
| WO | WO 2008/003176 A1 | 1/2008 |

* cited by examiner

LIGHT EMITTING DEVICE PACKAGE AND LIGHTING SYSTEM

The present application claims priority under 35 U.S.C. 119 to Korean Patent Application No. 10-2010-0051998 filed Jun. 1, 2010, which is hereby incorporated by reference in its entirety.

BACKGROUND

The embodiment relates to a light emitting device package and a lighting system.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement.

In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device package capable of improving light efficiency and a lighting system having the light emitting device package.

The embodiment provides a light emitting device package capable of uniformly discharging light and a lighting system having the light emitting device package.

According to the embodiment, a light emitting device package comprises a body comprising a recess and a plurality of light emitting device receiving parts formed in a bottom surface of the recess, a plurality of light emitting devices separately positioned in the light emitting device receiving parts, a plurality of individual lenses spaced apart from each other on the light emitting device receiving parts, and a common lens covering the individual lenses, wherein at least one of the plurality of individual lenses comprises a concave part formed at the upper portion of the individual lens.

According to the embodiment, a lighting system comprises a board, and a light emitting module comprising a light emitting device package provided on the board. The light emitting device comprises a body comprising a recess and a plurality of light emitting device receiving parts formed in a bottom surface of the recess, a plurality of light emitting devices separately positioned in the light emitting device receiving parts, a plurality of individual lenses spaced apart from each other on the light emitting device receiving parts, and a common lens covering the individual lenses, wherein at least one of the plurality of individual lenses comprises a concave part formed at the upper portion of the individual lens.

As described above, according to the present embodiment, the receiving parts, the resin members, and individual lenses are provided corresponding to each of light emitting devices. Therefore, since the individual lenses can have a structure suitable for light efficiency, the efficiency of the light emitting device package can be improved.

In addition to the individual lenses, the common lens having a refractive index lower than that of the individual lenses is additionally provided, so that efficiency can be more improved.

In addition, based on the characteristics of the light emitting devices, the resin members may comprise different luminescence materials, or the individual lenses may have different shapes and different characteristics. Therefore, various light emitting device packages can be manufactured suitably for desired characteristics. In particular, if the individual lenses have different curvatures or different refractive indexes based on the efficiency, a light can be uniformly discharged even in various types of the combination of light emitting devices and luminescence materials.

DETAILED DESCRIPTION OF THE EMBODIMENTS

Figure 1:
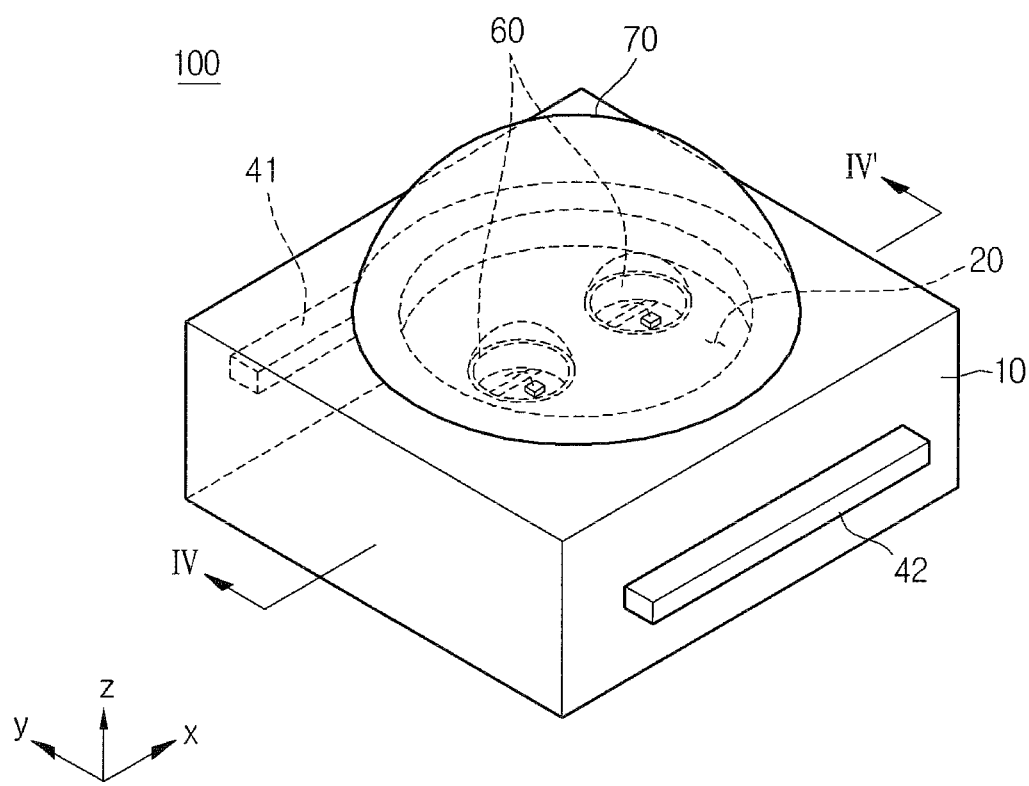
FIG. 1 is a perspective view showing a light emitting device package according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, embodiments will be described with reference to accompanying drawings.

Figure 2:
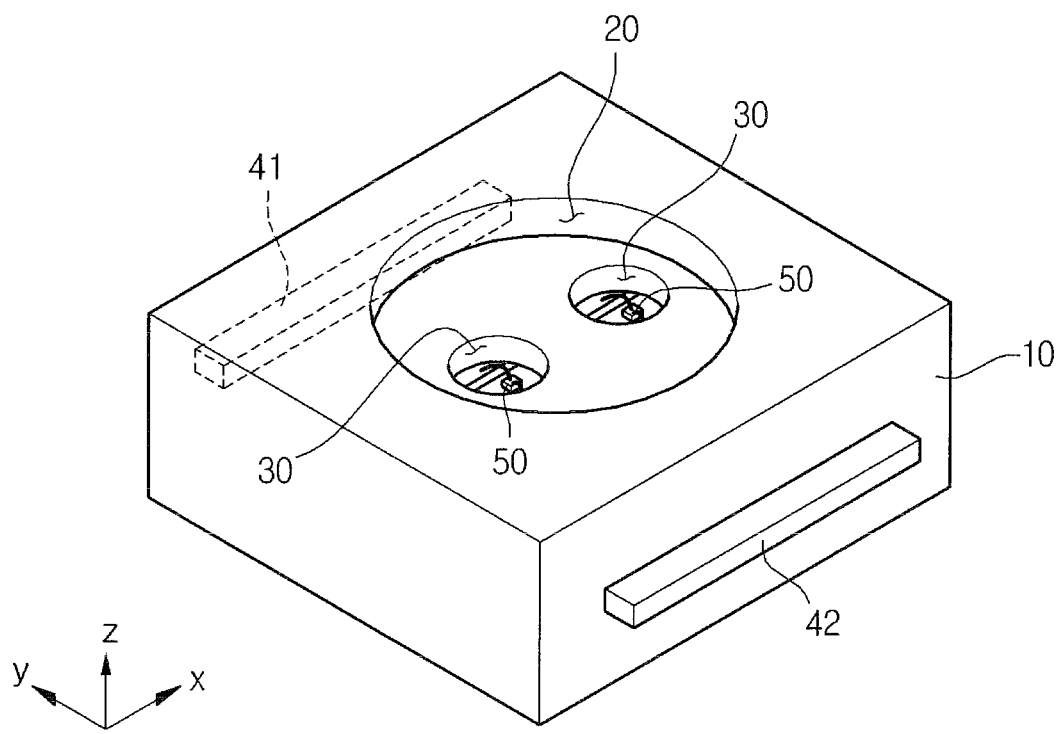
FIG. 2 is a perspective view showing a light emitting device package of FIG. 1 without individual lenses, common lenses, and resin members.
Figure 3:
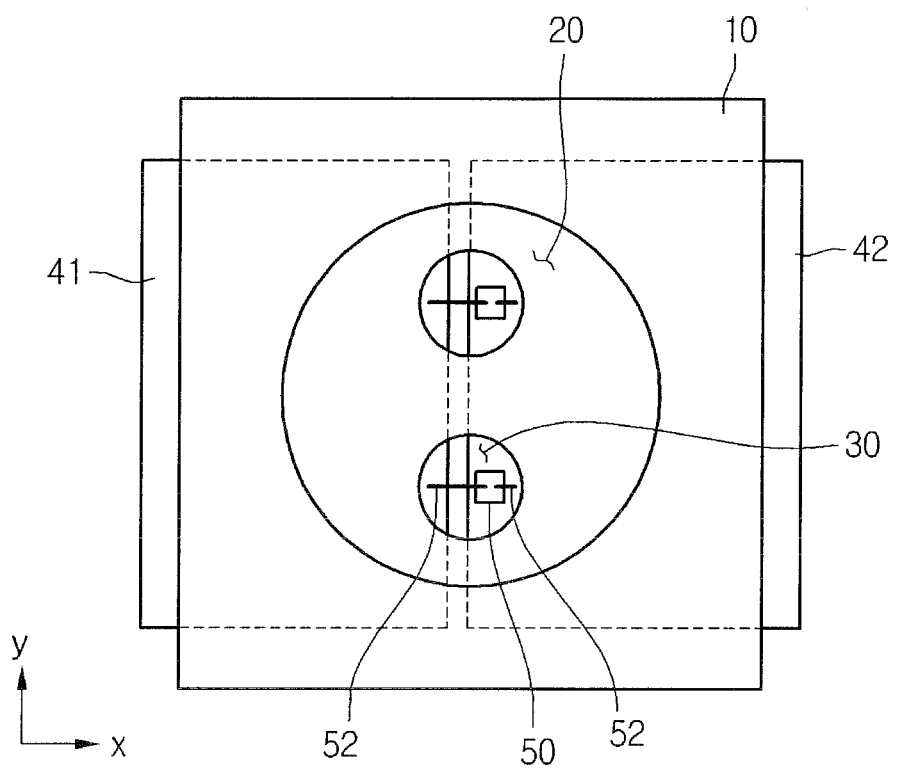
FIG. 3 is a plan view of FIG. 2.

FIG. 1 is a perspective view showing a light emitting device package according to a first embodiment, and FIG. 2 is a perspective view showing a light emitting device package without an individual lens, a common lens, and a resin member. FIG. 3 is a plan view of FIG. 2.

Referring to FIGS. 1 to 3, a light emitting device package 100 according to the first embodiment may comprise a body 10 comprising a recess 20 and a plurality of light emitting device receiving part (hereinafter, referred to as "receiving part") 30, a plurality of light emitting devices 50 individually positioned in the receiving part 30, first and second electrodes 41 and 42, and a plurality of individual lenses 60. In addition, the light emitting device package 100 may comprise a common lens 70 to cover the individual lenses 60.

Hereinafter, the above structure will be described in more detail.

The body 10 may comprise at least one of resin such as PPA (polyphthal amide), LCP (liquid crystal polymer), and PA9T (polyamid9T), metal, photo sensitive glass, sapphire ($Al_2O_3$), a ceramic substrate, and printed circuit board (PCB), but the embodiment is not limited thereto.

The body 10 may have various shapes according to the use and design of the light emitting device package 100. For instance, the body 10 may have various shapes such as a rectangular shape or a circular shape when viewed in a plan view.

The body 10 has the recess 20 having an open upper portion. Although drawings show that the recess 20 has a circular shape when viewed in a plan view, the embodiment is not limited thereto. Accordingly, the recess 20 may have a polygonal shape comprising a rectangular shape when viewed in a plan view.

A lateral surface of the recess 20 may be perpendicular to a bottom surface of the recess 20 or inclined with respect to the bottom surface of the recess 20. If the recess 20 has an inclined lateral surface, the lateral surface of the recess 20 may be inclined at an angle ($\theta 1$ of FIG. 4, and the same applies hereinafter) in a range of about 100° to about 170° to the bottom surface of the recess 20. If the angle $\theta 1$ is above 120°, a light emitted from the light emitting device 50 can be sufficiently reflected.

A plurality of receiving parts 30 are formed in the bottom surface of the recess 20. The receiving parts 30 individually receive the light emitting devices 50. When viewed in a plan view, the receiving parts 30 have a circular shape, but the embodiment is not limited thereto. Accordingly, the receiving parts 30 may have a polygonal shape comprising a rectangular shape when viewed in a plan view.

A lateral surface of the receiving part 30 may be perpendicular to a bottom surface of the receiving part 30 or inclined with respect to the bottom surface of the receiving part 30. If the receiving part 30 has an inclined lateral surface, the lateral surface of the receiving part 30 may be inclined at an angle ($\theta 2$ of FIG. 4, and the same applies hereinafter) in a range of about 100° to about 170° to the bottom surface of the receiving part 30. If the angle $\theta 2$ is above 120°, a light emitted from the light emitting device 50 can be sufficiently reflected.

The body 10 comprising the recess 20 and the receiving parts 30 may have a stack structure of multiple layers, or may be formed through an injection molding scheme. In addition, the body 10 may be formed through various schemes.

The body 10 is provided therein with the first and second electrodes 41 and 42 electrically connected to the light emitting device 50. The first and second electrodes 41 and 42 may be formed by using a metallic plate having a predetermined thickness, and may be plated on the surface thereof with another metallic layer. The first and second electrodes 41 and 42 may comprise a metal having superior conductivity, and the metal may comprise a material selected from the group consisting of titanium (Ti), copper (Cu), nickel (Ni), gold (Au), chrome (Cr), tantalum (Ta), platinum (Pt), tin (Sn), and silver (Ag).

Portions of the first and second electrodes 41 and 42 may be exposed through the receiving parts 30, and remaining portions of the first and second electrodes 41 and 42 may be exposed to the outside through the inner part of the body 10. Although the first and second electrodes 41 and 42 make contact with the bottom surface of the receiving part 30 according to the present embodiment, the embodiment is not limited thereto. Accordingly, the first and second electrodes 41 and 42 may make contact with the bottom surface of the recess 20, or may make contact with a top surface of the body 10.

The light emitting device 50 is positioned in the receiving part 30 and electrically connected to the first and second electrodes 41 and 42. The light emitting device 50 may be electrically connected to the first and second electrodes 41 and 42 through a wire bonding scheme with a wire 52.

The light emitting device 50 may be prepared in the form of a lateral-type chip in which two electrode layers are exposed upward, or a vertical-type chip in which two electrode layers are positioned in opposition to each other about a light emitting layer. In this case, the lateral-type chip may be coupled with first and second electrodes 41 and 42 through the wire 52. The vertical-type chip may make contact with one of the first and second electrodes 41 and 42 and may be coupled with the other by the wire 52. FIGS. 2 and 3 show the lateral-type chip as an example.

However, the embodiment is not limited thereto. In other words, in addition to the wire bonding scheme, a die bonding scheme or a flip chip scheme may be employed to electrically connect the light emitting device 50 with the first and second electrodes 41 and 42.

Resin members 82 and 84 (see FIG. 4, and the same applies hereinafter) are filled in the receiving part 30 to seal the light emitting device 50. The resin members 82 and 84 may comprise a transmissive material such as silicone or epoxy. The resin members 82 and 84 may comprise a luminescence material of absorbing a light emitted from the light emitting device 50 to emit a light having different wavelengths.

Individual lenses 60 having a convex shape are positioned on the resin members 82 and 84. The individual lens may be formed by molding resin, or may be provided by attaching a separately-manufactured lens. Although the resin members 82 and 84 have a structure different from that of the individual lenses 60 as shown in drawings or as described above, the resin members 82 and 84 may be formed together with the individual lenses 60 through the same process. The individual lenses 60 have at least portions making contact with the recess 20.

The common lens 70 is provided on the recess 20 to cover the individual lenses 60. The common lens 70 may be formed by molding a resin or provided by attaching a separately-manufactured lens onto the recess 20. If the common lens 70 comprises a resin, the common lens 70 may comprise a fluorescence material. The common lens 70 may be separated from the individual lens 60.

Figure 4:
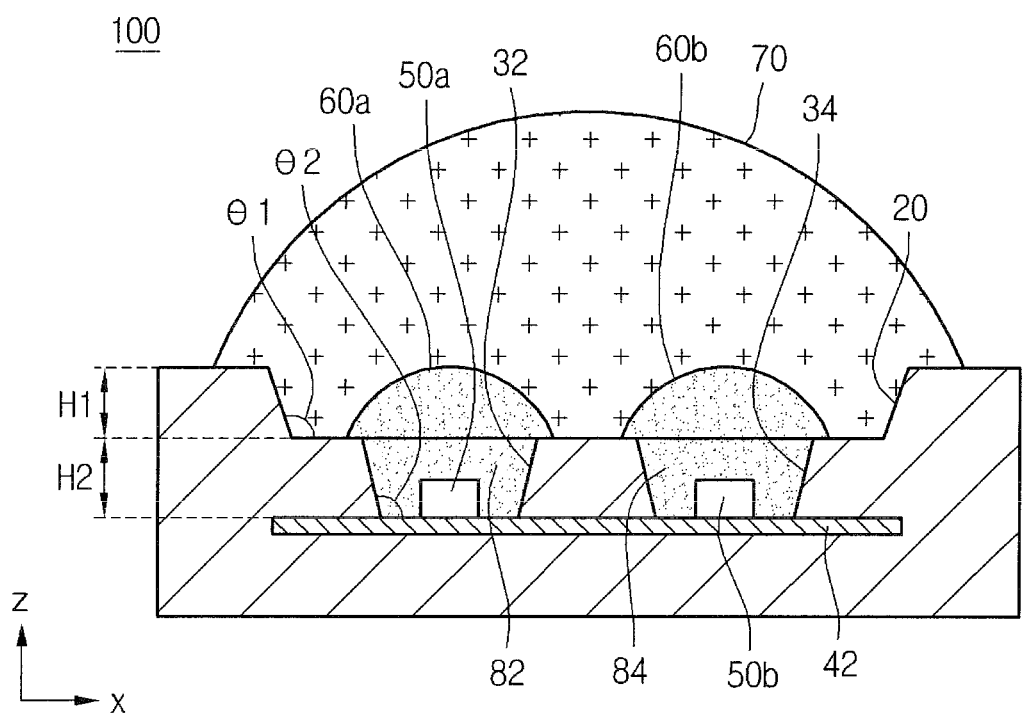
FIG. 4 is a sectional view taken along line IV-IV of FIG. 1.

Hereinafter, the recess 20, the receiving part 30, the light emitting device 50, the individual lens 60, the common lens 70, and the resin members 82 and 84 according to the present embodiment will be described in more detail with reference to FIG. 4. FIG. 4 is a sectional view taken along line IV-IV of FIG. 1.

According to the present embodiment, one recess 20 is provided therein with a plurality of receiving parts 32 and 34 to individually receive a plurality of light emitting devices 50a and 50b. Hereinafter, representatively, the receiving parts 32 and 34 may comprise the first and second receiving parts 32 and 34.

In this case, if the resin members 82 and 84 comprise a fluorescence material, the receiving parts 32 and 34 may have a depth H2 greater than those of light emitting devices 50a and 50b such that the resin members 82 and 84 may comprise a sufficient amount of luminescence material. For example, the depth H2 of the receiving parts 32 and 34 may be above 30 μm greater than those of the light emitting devices 50a and 50b. The recess 20 has a depth H1 less than the depth H2 of the receiving parts 32 and 34. If the depth H1 of the recess 20 is excessively increased, an amount of lost light may be increased due to the reflection.

As described above, according to the present embodiment, the depth H1 of the recess 20 and the depth H2 of the receiving parts 32 and 34 are optimized, so that the efficiency of the light emitting device package 100 can be more improved.

The light emitting devices 50a and 50b are provided in the receiving parts 32 and 34 as one-to-one correspondence. In other words, the first light emitting device 50a is provided in the first receiving part 32, and the second light emitting device 50b is provided in the second receiving part 34. In addition, the first resin member 82 is provided in the first receiving part 32, and the second resin member 84 is provided in the second receiving part 34.

In this case, the first and second light emitting devices 50a and 50b may comprise homogenous light emitting devices to emit lights having the same wavelength or may comprise heterogeneous light emitting devices to emit lights having different wavelengths. The first resin member 82, the second resin member 84, and the common lens 70 may comprise homogeneous fluorescence material or heterogeneous fluorescence materials. The fluorescence material may comprise a material selected from the group consisting of sulfide, silicate, yttrium aluminum garnet (YAG), oxynitride, and nitride-based luminescence materials.

According to one example, the first and second light emitting devices 50a and 50b emit a blue light, and the first and second resin members 82 and 84 may comprise a fluorescence material to emit a yellow light (hereinafter, as yellow fluorescence material).

According to another embodiment, the first and second light emitting devices 50a and 50b emit a blue light, the first resin member 82 may comprise a yellow fluorescence material, and the second resin member 84 may comprise a fluorescence material to emit a green light (hereinafter, referred to as a green fluorescence material). In this case, the combination of the first light emitting device 50a and the yellow fluorescence material can represent efficiency superior to efficiency represented in the combination of the second light emitting device 50b and the green fluorescence material. In addition, the common lens 70 may comprise a fluorescence material to emit a red light (hereinafter, referred to as red fluorescence material).

In other words, since only one resin member can be used according to the related art, different resin members cannot be used for the light emitting devices 50a and 50b. According to the present embodiment, since the first and second light emitting devices 50a and 50b are positioned in the first and second receiving parts 32 and 34, respectively, the first and second resin members 82 and 84 may comprise different fluorescence materials. Therefore, fluorescence materials may be employed by taking the characteristic of the first and second light emitting devices 50a and 50b into consideration.

In addition, since heterogeneous fluorescence materials may be positioned in the receiving parts 32 and 34 and/or the recess 20, which are spaced different from each other, problems caused by the mixture of the heterogeneous fluorescence materials can be prevented. For example, when a red fluorescence material is mixed with another fluorescence material, the red fluorescence material absorbs a light having a wavelength changed by another fluorescence material. Accordingly, the whole brightness and efficiency can be degraded. According to the present invention, the red fluorescence material is positioned at a space different from that of another fluorescence material, so that brightness can be prevented from being degraded.

A first individual lens 60a is provided on the first receiving part 32, and a second individual lens 60b spaced apart from the first individual lens 60a is positioned on the second receiving part 34. According to the present embodiment, the first and second individual lenses 60a and 60b may be provided on the lateral surface of the recess 20 while being spaced apart from each other at a predetermined distance, and may have a convex shape on the light emitting devices 50a and 50b, respectively.

If only one lens is provided corresponding to the light emitting devices 50a and 50 according to the related art, the lens may have a smooth-curved surface. Accordingly, the total refection excessively occurs on the surface of the lens, so that the light efficiency can be reduced. In contrast, according to the present embodiment, if the first and second individual lenses 60a and 60b are provided corresponding to the first and second light emitting devices 50a and 50b, the lens surface may have a greater curvature. Accordingly, the total reflection can be reduced, so that the light efficiency can be improved.

In this case, the first and second individual lenses 60a and 60b may have a substantially-hemispherical shape when taking light efficiency into consideration. According to the related art, if the hemispherical lens is used when one lens is used for the light emitting devices 50a and 50b, the thickness of the light emitting device package 100 may be excessively thickened. Accordingly, the hemispherical lens cannot be used. In contrast, according to the present embodiment, since the first and second individual lenses 60a and 60b are separately employed, the first and second individual lenses 60a and 60b may have a hemispherical shape representing superior light efficiency.

In addition, since the first and second individual lenses 60a and 60b are provided, the shapes and the materials of the first and second individual lenses 60a and 60b may be determined while taking the characteristics of the first and second light emitting devices 50a and 50b into consideration. Therefore, the light emitting device package 100 may be formed in various structures. Another embodiment of employing different shapes and different materials in the first and second individual lenses 60a and 60b will be described with reference to FIGS. 22 to 25 below.

The common lens 70 is provided to cover the first and second individual lenses 60a and 60b. Since the common lens 70 has a refractive index smaller than those of the first and second individual lenses 60a and 60b, light extraction efficiency can be more improved. In other words, since a light is transmitted from a material having a high refractive index to a material having a low refractive index, light loss caused by Fresnel reflection can be minimized.

As described above, according to the present embodiment, various light emitting device packages 100 can be manufactured by taking the characteristics of the light emitting devices 50a and 50b into consideration. Accordingly, the efficiency of the light emitting device package 100 can be improved.

The modifications in the shapes of the individual lenses and/or the common lens according to the first embodiment will be described with reference to FIGS. 5 to 11. For the clear explanation, structures and components same to or greatly similar to those of the first embodiment will not be further described, and only structures and components different from those of the first embodiment will be described in detail.

Figure 5:
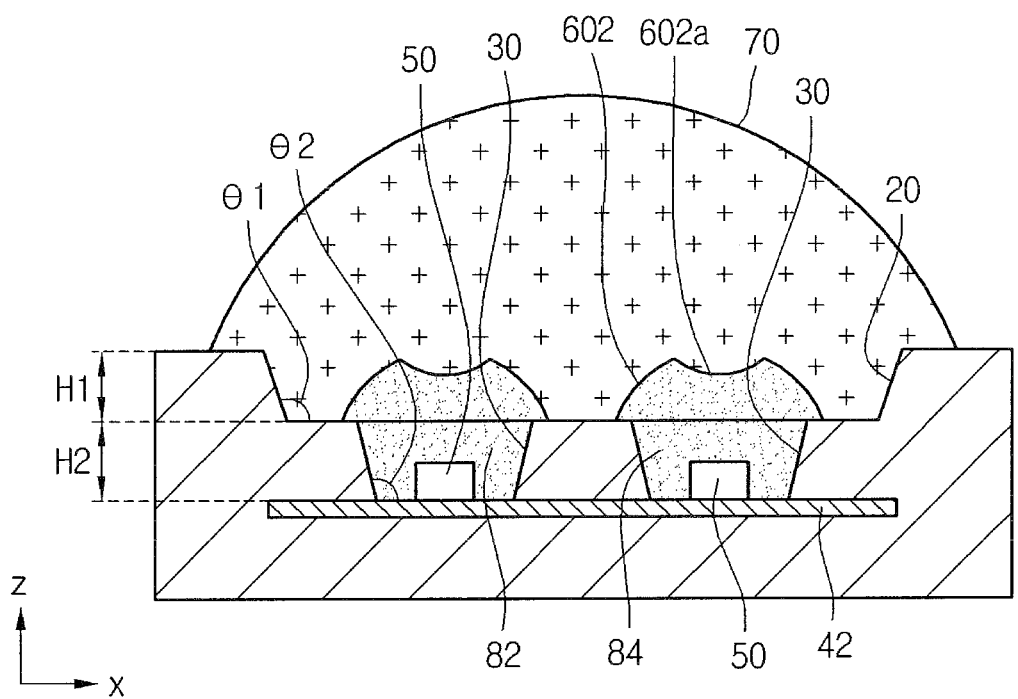
FIG. 5 is a sectional view showing a light emitting device package according to a first modification of a first embodiment.

FIG. 5 is a sectional view showing a light emitting device package according to a first modification of the first embodiment.

Referring to FIG. 5, according to the present modification, a concave part 602 is formed at an upper portion of an individual lens 602. The concave part 602a may be recessed toward the bottom surface of the recess 20, and connected with the individual lens 602 while forming a gently-curved surface. The concave part 602a guides a light so that the light can be extracted to the outside through a peripheral portion of the individual lens 602. In other words, the orientation angle of the light can be widened by using the individual lens 602.

Figure 6:
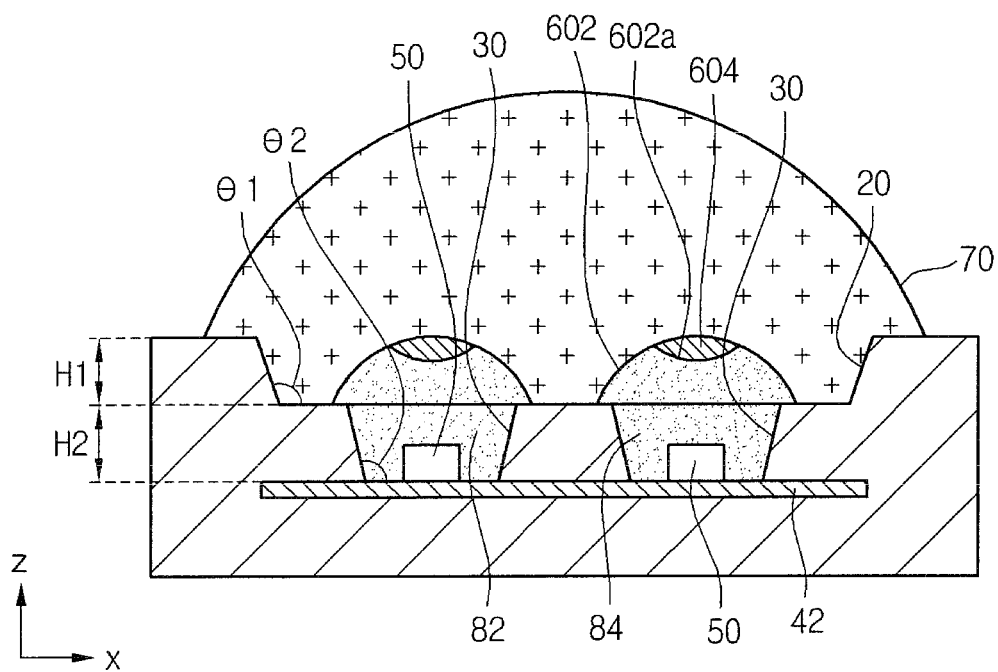
FIG. 6 is a sectional view showing a light emitting device package according to a second modification of the first embodiment.

FIG. 6 is a sectional view showing a light emitting device package according to a second modification of the first embodiment.

Referring to FIG. 6, the concave part 602a is formed at the upper portion of an individual lens 602 in the light emitting device package according to the present modification, and a reflective material 604 is provided in the concave part 602a. The reflective material 604 may occupy about 5% to about 60% of the top surface of the individual lens 602.

The reflective material 604 provided in the concave part 602a reflects a light emitted from the light emitting device 50 or a light traveling to the concave part 602a among lights reflected by the lateral surface or the bottom surface of the receiving part 30. Therefore, the light emitted from the light emitting device 50 or the light reflected by the lateral surface or the bottom surface of the receiving part 30 is extracted to the outside through a region without the concave part 602a. Accordingly, since a light is extracted to the outside through the peripheral portion of the individual lens 602, a light having a wide orientation angle can be provided.

For example, the reflective material 604 may be formed by mixing an organic material having above 70% of transmittance with an inorganic material capable of reflecting or scattering a light and provided in the concave part 602a. The inorganic material may comprise at least one selected from the group consisting of $TiO_2$, $SiO_2$, Al, $Al_2O_3$, and Ag. A light can be totally reflected or partially reflected according to mixture ratios of the organic material and the inorganic material. The mixture ratio of the organic material and the inorganic material may be in the range of 1:0.001 to 1:1.

In addition, for instance, the reflective material 604 may comprise a deposition layer comprising at least one selected from the group consisting of $SiO_2$, $TiO_2$, Al, Ag, and Ti. The deposition layer may have a thickness of about 100□.

In the light emitting device package according to the present embodiment, the concave part 602a is formed in the individual lens 602 overlapping with the light emitting device perpendicularly to the light emitting device 50, and the reflective material 604 is provided in the concave part 602a, so that the orientation angle of the light emitted from the light emitting device 50 can be adjusted.

Figure 7:
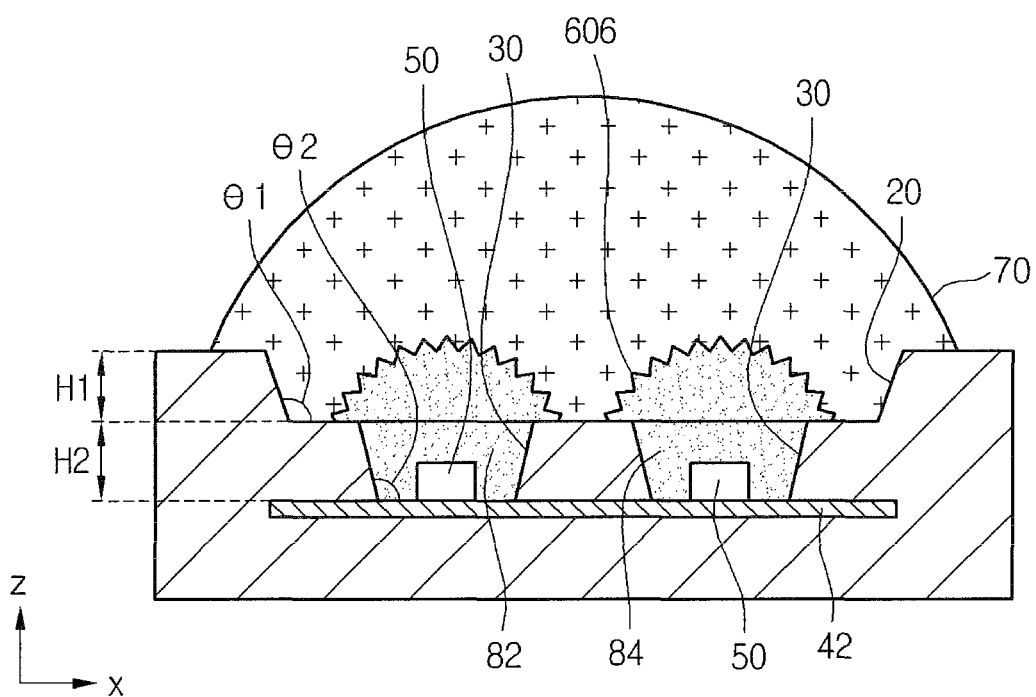
FIG. 7 is a sectional view showing a light emitting device package according to a third modification of the first embodiment.

FIG. 7 is a sectional view showing a light emitting device package according to a third modification of the first embodiment.

Referring to FIG. 7, according to the present modification, an individual lens 606 is provided on a surface thereof with a predetermined pattern, for example, a concavo-convex pattern. This pattern refracts or diffuses a light emitted from the light emitting device 50 when the light is transmitted or reflected. Accordingly, a light may be emitted with uniform light intensity distribution from the central portion or the lateral portion of the individual lens 606. In addition, color variation between the central portion and the lateral portion of the individual lens 606 can be reduced.

Figure 8:
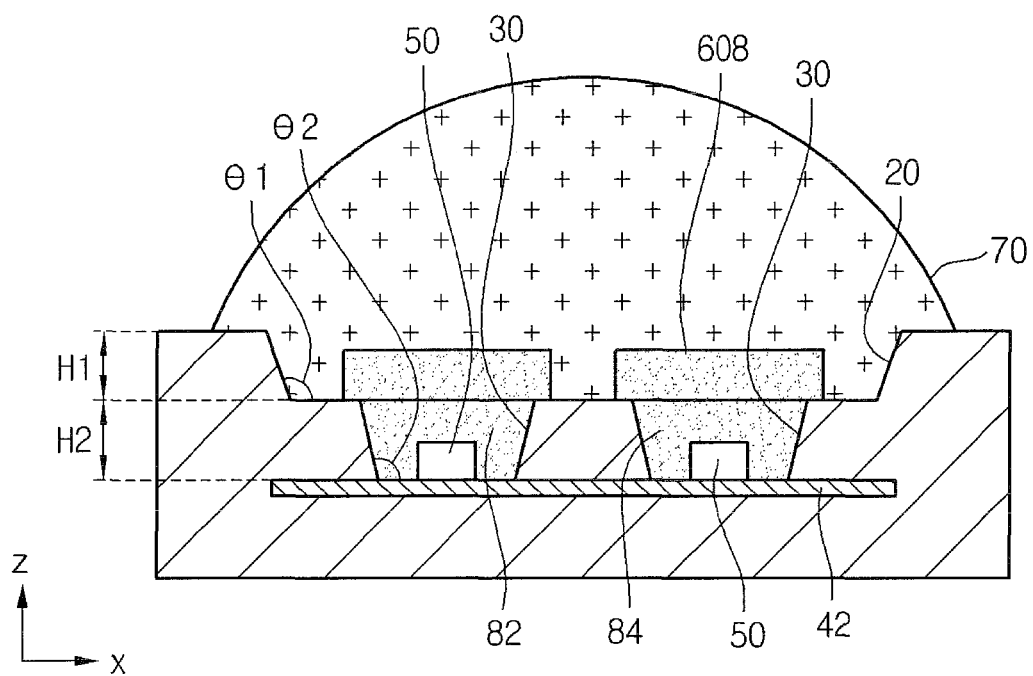
FIG. 8 is a sectional view showing a light emitting device package according to a fourth modification of the first embodiment.

FIG. 8 is a sectional view showing a light emitting device package according to a fourth modification of the first embodiment.

Referring to FIG. 8, an individual lens 608 may comprise a rectangular lens in the light emitting device package according to the present modification. As described above, according to the present modification, the individual lens 608 may have various shapes.

Figure 9:
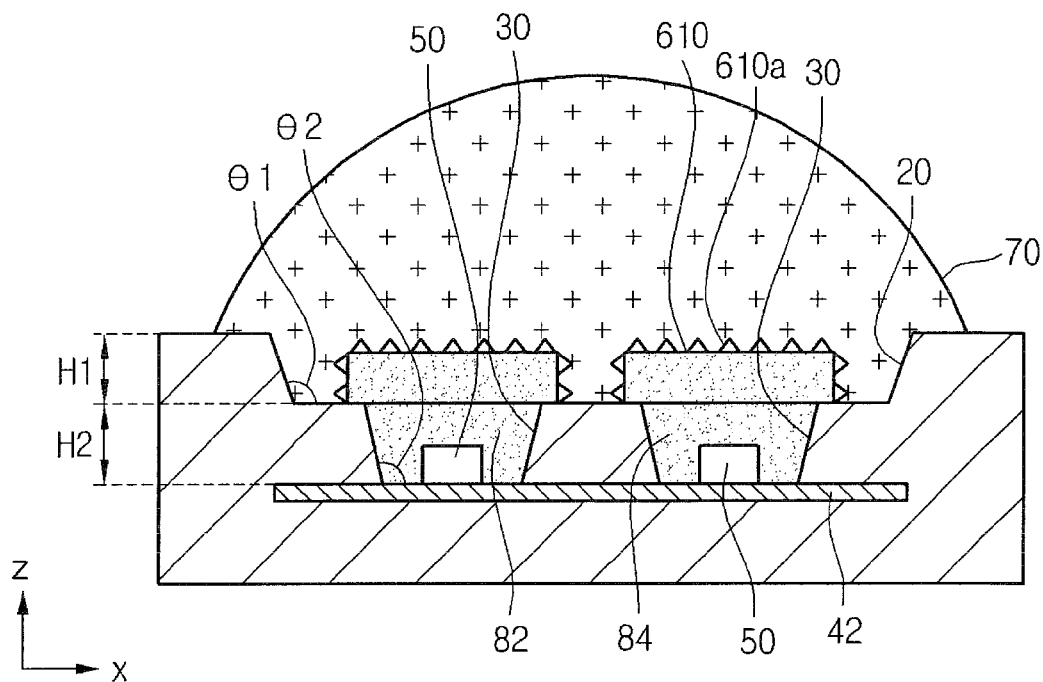
FIG. 9 is a sectional view showing a light emitting device package according to a fifth modification of the first embodiment.

FIG. 9 is a sectional view showing a light emitting device package according to a fifth modification of the first embodiment.

Referring to FIG. 9, in the light emitting device package according to the present modification, an individual lens 610 may comprise a rectangular lens, and the individual lens 610 may comprise a micro-lens 610a. Although FIG. 9 shows that the micro-lens 610a has a triangular sectional surface as an example, the present modification is not limited thereto. Accordingly, the micro-lens 610a may have a circular sectional surface, an oval sectional surface, or a polygonal sectional surface.

The individual lens 610 having the micro-lens 610a can easily mix colors of lights with each other by refracting lights emitted from the light emitting device 50.

Figure 10:
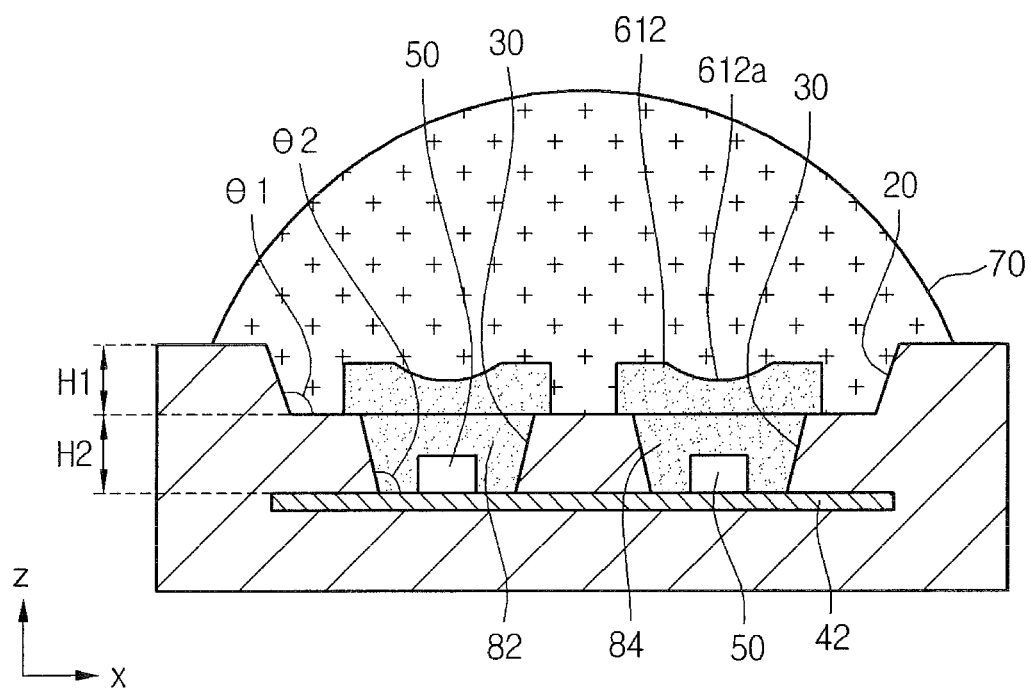
FIG. 10 is a sectional view showing a light emitting device package according to a sixth modification of the first embodiment.

FIG. 10 is a sectional view showing a light emitting device package according to a sixth modification of the first embodiment.

Referring to FIG. 10, in the light emitting device package according to the present modification, an individual lens 612 may comprise a rectangular lens, and a concave part 612a is formed at the upper portion of the individual lens 612. The orientation angle of the light emitted from the light emitting device 50 can be widened by the concave part 612a.

Figure 11:
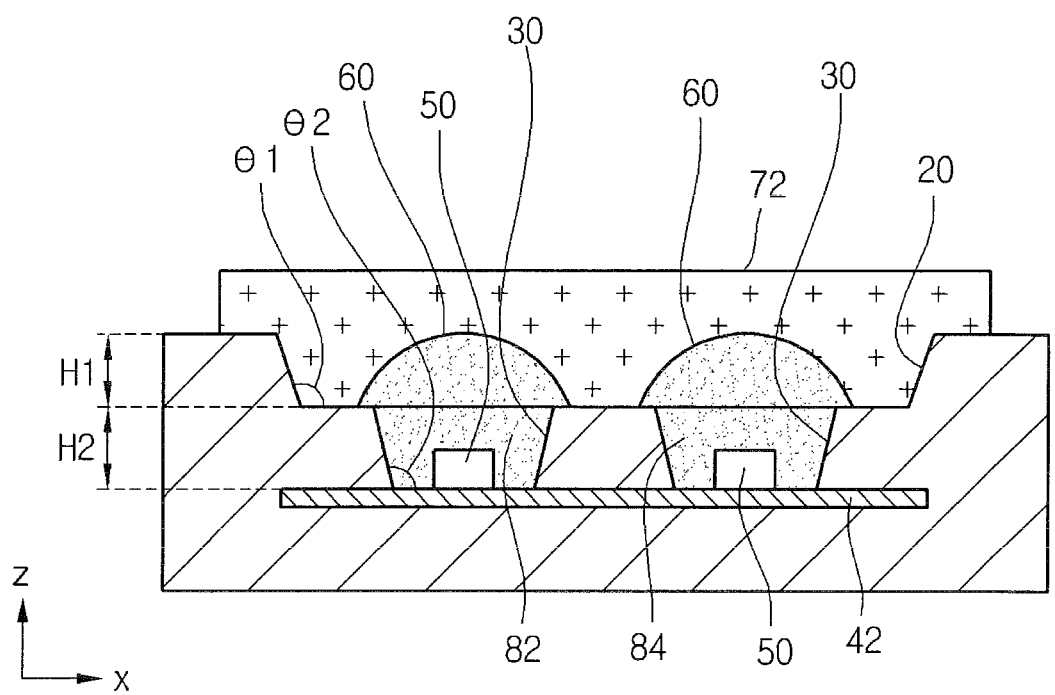
FIG. 11 is a sectional view showing a light emitting device package according to a seventh modification of the first embodiment.

FIG. 11 is a sectional view showing a light emitting device package according to a seventh modification of the first embodiment.

Referring to FIG. 11, in the light emitting device package according to the present modification, the common lens may comprise a rectangular lens. As described above, according to the present modification, the common lens 72 having various shapes may be used. The common lens 72 may be provided therein with the micro-lens shown in FIG. 9 or the concave part shown in FIG. 10.

A modification in the arrangement of a fluorescence material according to the first embodiment will be described with reference to FIGS. 12 to 14. For the purpose of clear explanation, structures and components same to or greatly similar to those of the first embodiment will not be further described, and only structures and components different from those of the first embodiment will be described in detail.

Figure 12:
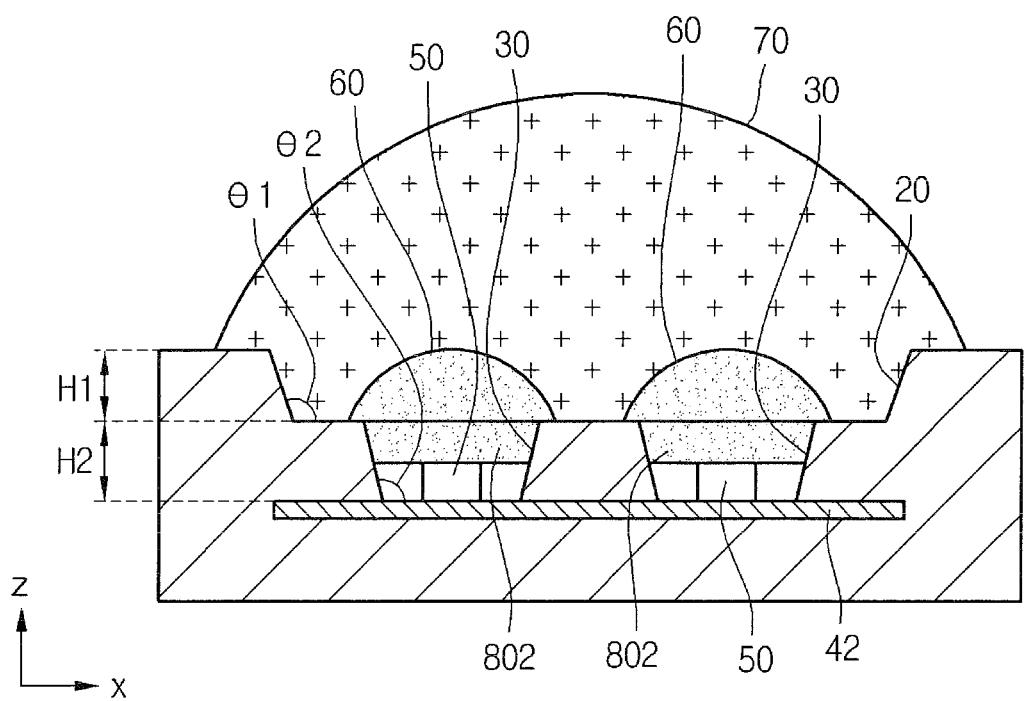
FIG. 12 is a sectional view showing a light emitting device package according to an eighth modification of the first embodiment.

FIG. 12 is a sectional view showing a light emitting device package according to an eighth modification of the first embodiment.

Referring to FIG. 12, the present modification makes a difference from the first embodiment of employing resin comprising a fluorescence material and filled in the receiving part 30 in that a film 802 comprising a fluorescence material is coated on the light emitting device 50.

The film 802 may be formed by inserting a fluorescence material into a transmissive film. The transmissive film may comprise a transparent material comprising one selected from the group consisting of polycarbonate, poly (methyl methacrylate), polypropylene, quartz, and glass. The fluorescence material may comprise a material selected from the group consisting of sulfide, silicate, yttrium aluminum garnet (YAG), oxynitride, and nitride-based fluorescence materials.

If the film 802 is used, the fluorescence material can be uniformly distributed on the light emitting device 50 contributing to light emission.

Figure 13:
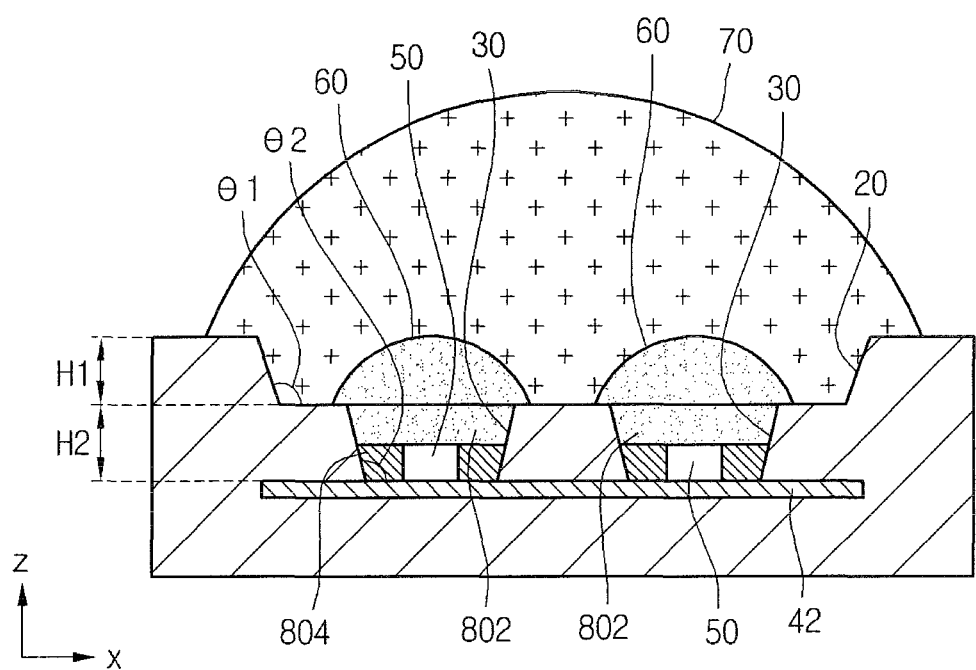
FIG. 13 is a sectional view showing a light emitting device package according to a ninth modification of the first embodiment.

FIG. 13 is a sectional view showing a light emitting device package according to a ninth modification of the first embodiment.

Referring to FIG. 13, according to the present modification, the film 802 comprising a fluorescence material is coated on the light emitting device 50, and a resin member 804 may be filled in other inner parts of the receiving part 30. The resin member 804 may comprise epoxy or silicone. The film 802 may be more stably provided on the light emitting device 50 by the resin member 804.

Figure 14:
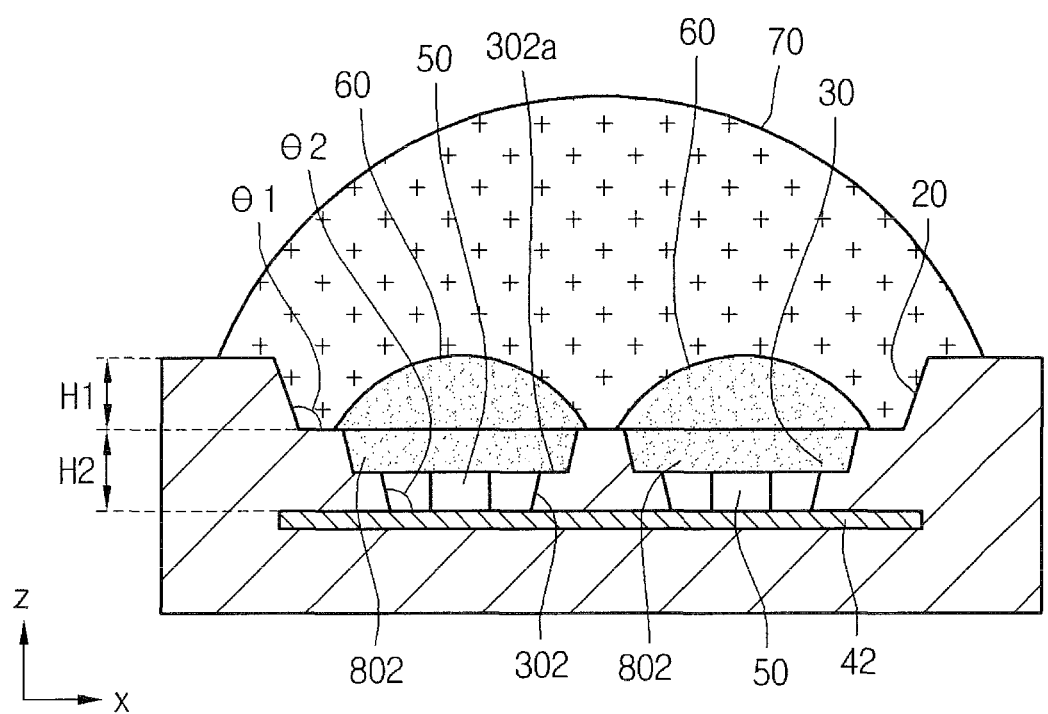
FIG. 14 is a sectional view showing a light emitting device package according to a tenth modification of the first embodiment.

FIG. 14 is a sectional view showing a light emitting device package according to a tenth modification according to the first embodiment.

Referring to FIG. 14, according to the present modification, a step 302a is formed at an upper portion of the receiving part 302, and the film 802 comprising a fluorescence material is provided in the step 302a. According to the present modification, the step 302a is formed at the upper portion of the receiving part 302, so that the film 802 can be stably fixed on the step 302a.

The step 302a may have a depth substantially same to the thickness of the film 802. However, the embodiment is not limited thereto, and the depth of the step 302a may be thinner than or thicker than the thickness of the film 802.

Although FIG. 14 shows the receiving part 302 having an empty space below the film 802, a resin member may be formed in the empty space as shown in FIG. 13.

A modification of the body according to the first embodiment will be described with reference to FIGS. 15 to 19. For the purpose of clear explanation, structures and components same to or greatly similar to those of the first embodiment will not be further described, and only structures and components different from those of the first embodiment will be described in detail.

Figure 15:
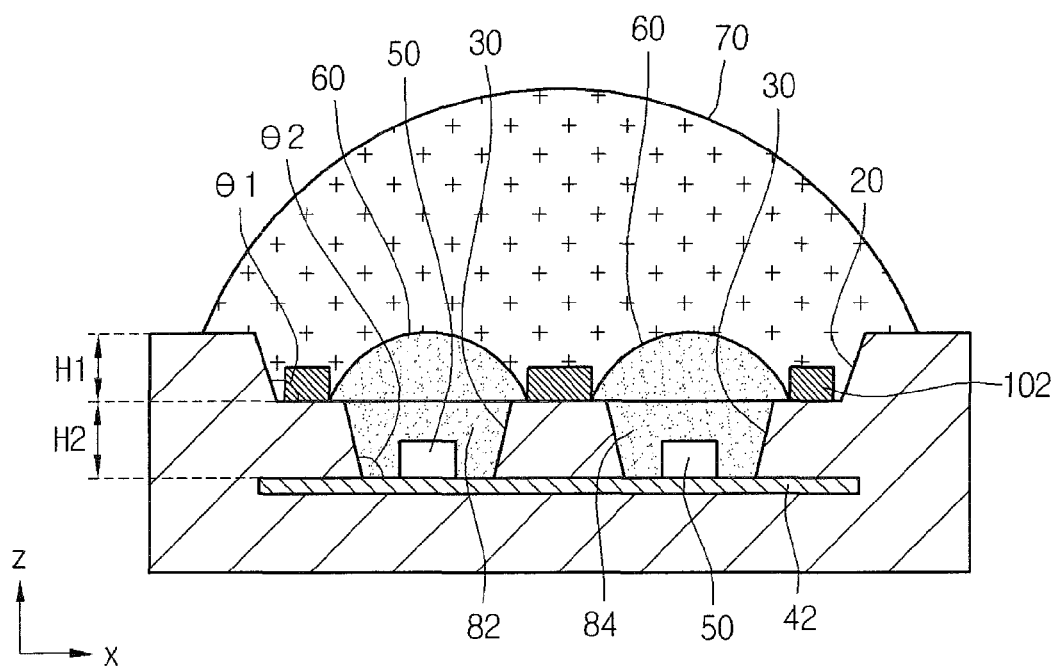
FIG. 15 is a sectional view showing a light emitting device package according to an eleventh modification of the first embodiment.
Figure 16:
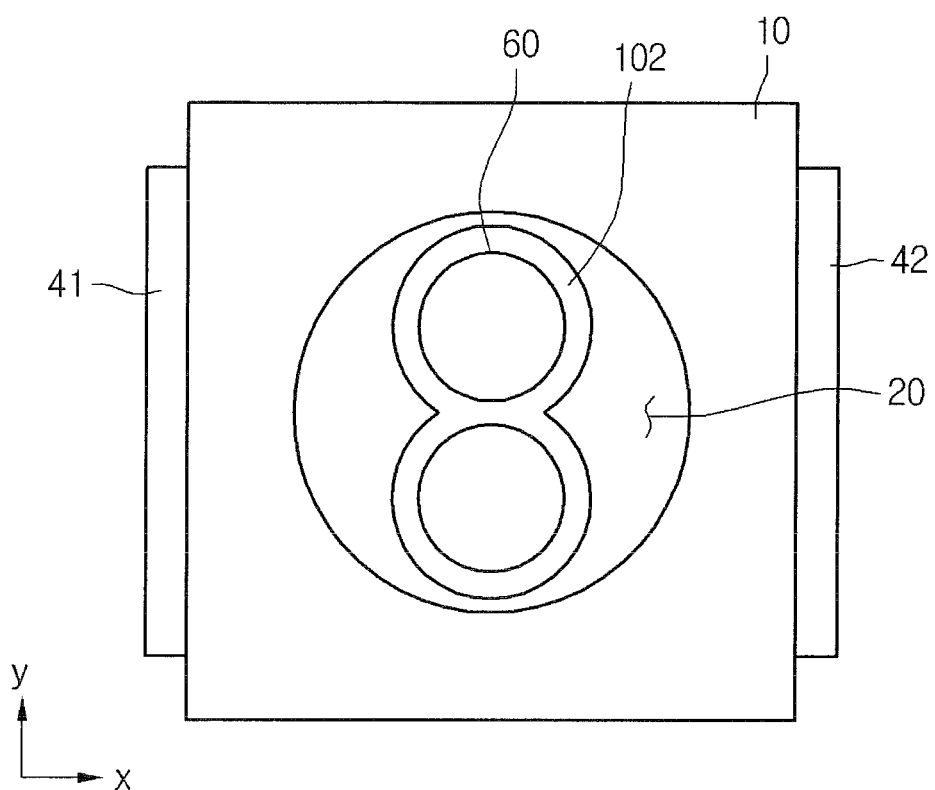
FIG. 16 is a plan view showing a light emitting device package according to an eleventh modification of the first embodiment.
Figure 17:
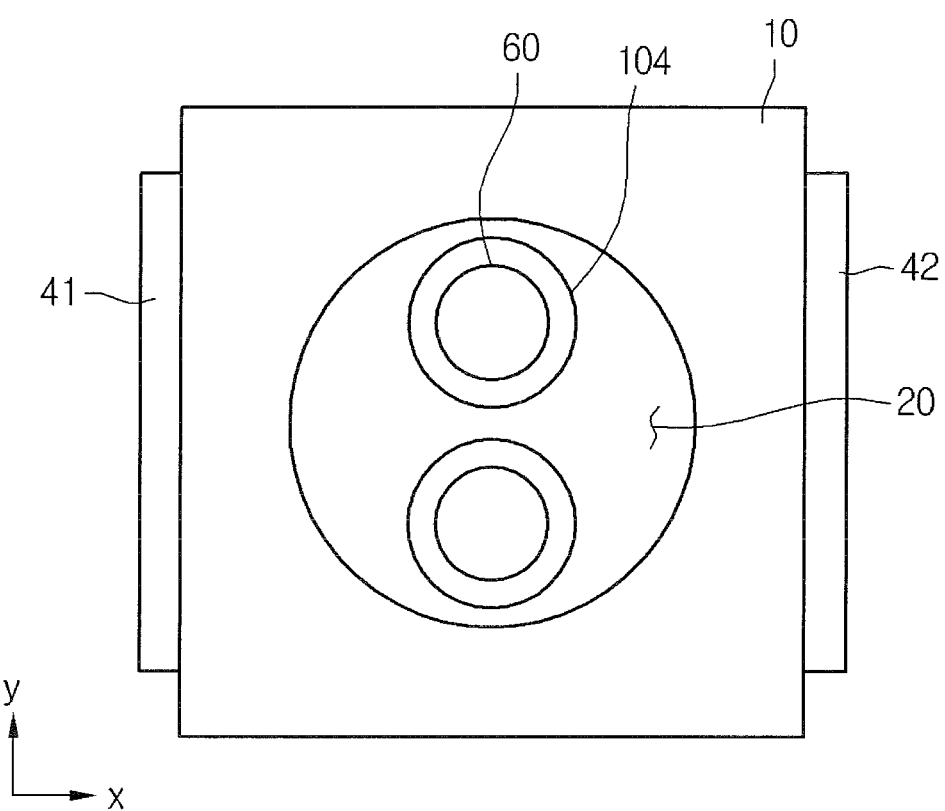
FIGS. 17 and 18 are plan views showing other examples of the eleventh modification of the first embodiment.
Figure 18:
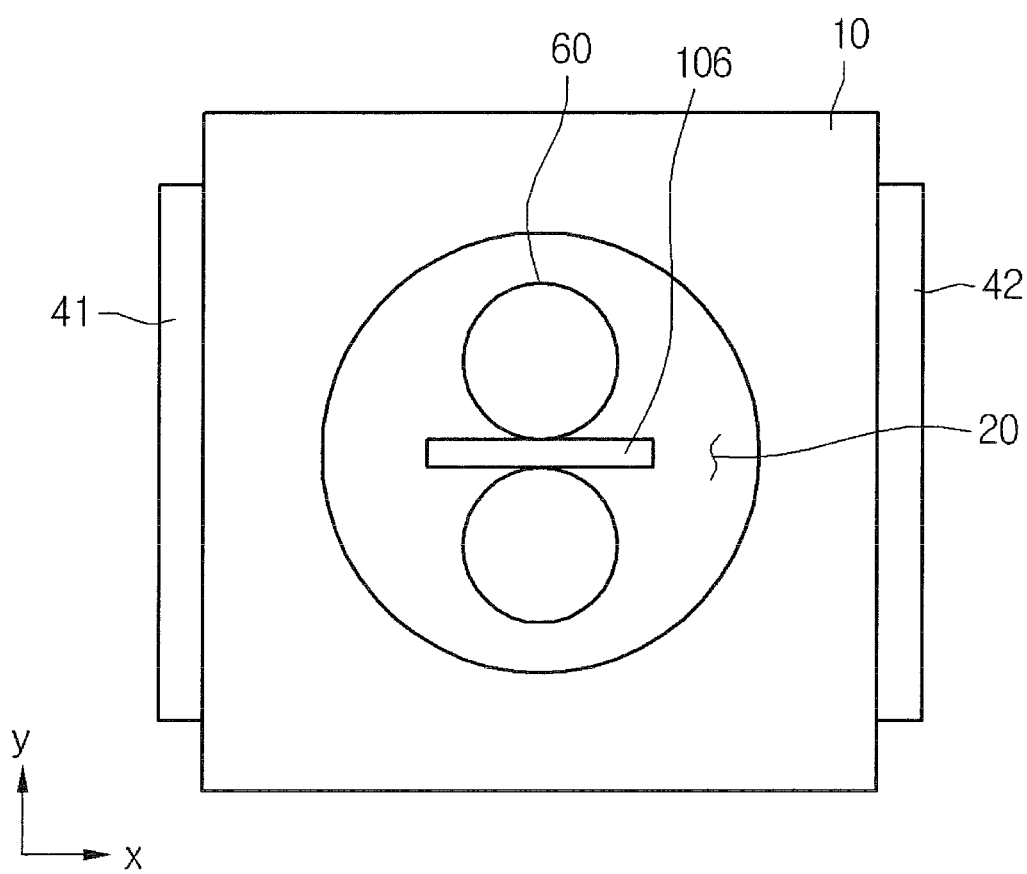

FIG. 15 is a sectional view showing a light emitting device package according to an eleventh modification of the first embodiment, and FIG. 16 is a plan view showing the light emitting device package according to the eleventh modification of the first embodiment. FIGS. 17 and 18 are plan views showing other examples of the eleventh modification of the first embodiment according to the present invention.

Referring to FIG. 15, the body 10 according to the present modification may comprise a guide member 102 to guide and fix the individual lens 60. The guide member 102 may be manufactured through a separate process and attached to the body 10. The guide member 102 may be formed integrally with the body 10 through an injection molding process of forming the body 10.

Referring to FIG. 16, the guide member 102 may have a closed loop shape formed along the edge of the individual lens 60. According to the present modification, since the individual lens 60 has a circular shape when viewed in a plan view, the guide member 102 may have a circular shape. If the individual lens 60 has a rectangular shape when viewed in a plan view, the guide member 102 may have a rectangular shape having a portion punched corresponding to the individual lens 60.

By the guide member 102, the individual lens 60 may be formed on a position on the light emitting device 50 capable of maximizing light efficiency Although FIG. 16 shows that the guide member 102 is integrated in one form to guide a plurality of individual lenses 60, the present embodiment is not limited thereto. As shown in FIG. 17, guide members 104 are spaced apart from each other to guide the individual lenses 60, respectively.

As shown in FIG. 18, the guide member 106 may have a straight line shape between the lenses 60. In addition, the guide member 105 may have various plan shapes.

Figure 19:
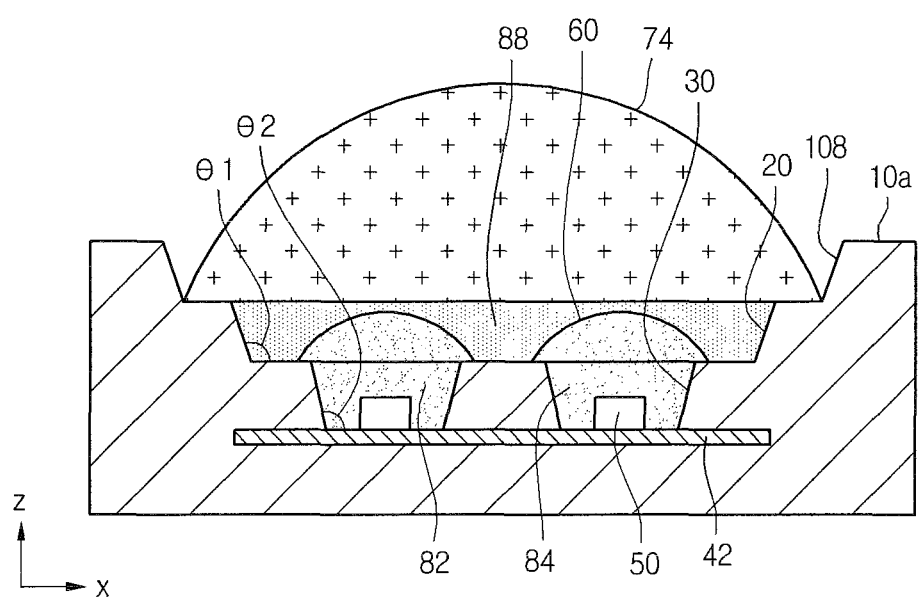
FIG. 19 is a sectional view showing a light emitting device package according to a twelfth modification of the first embodiment.

FIG. 19 is a sectional view showing a light emitting device package according to a twelfth modification of the first embodiment.

Referring to FIG. 19, a body 10a according to the present modification may comprise a step 108 to fix the common lens 74 on the upper portion of the body 10a. As shown in FIG. 19, the common lens 74 is a separately-manufactured lens, and a resin member 88 is filled in the recess 20 below the common lens 74. The resin member 88 may comprise a fluorescence material.

The common lens 74 can be firmly fixed on a desired position by the step 108.

Modifications of the first and second electrodes according to the first embodiment will be described with reference to FIG. 20.

Figure 20:
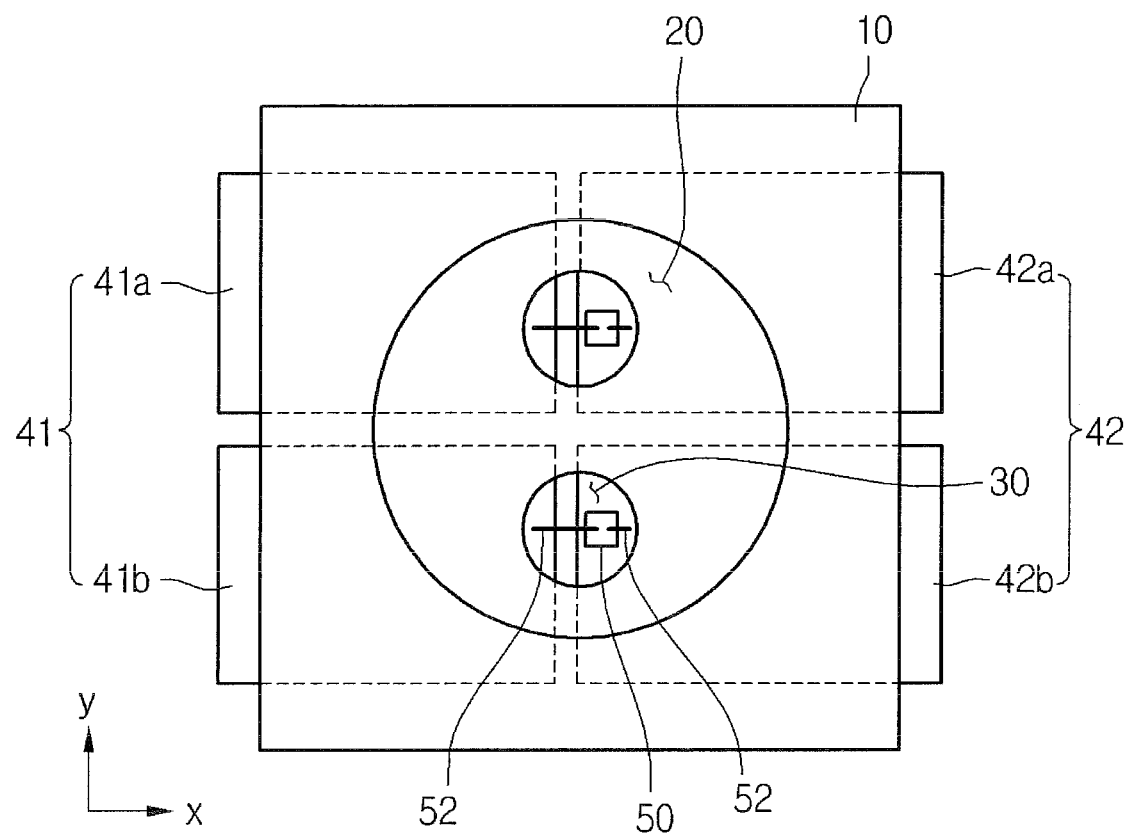
FIG. 20 is a sectional view showing a light emitting device package according to a thirteenth modification of the first embodiment.

FIG. 20 is a sectional view showing a light emitting device package according to a thirteenth modification of the first embodiment.

Referring to FIG. 20, the first electrode 41 according to the present embodiment may comprise a plurality of electrode parts 41a and 41b corresponding to a plurality of light emitting devices 50, and the second electrode 42 may comprise a plurality of light emitting parts 42a and 42b corresponding to the light emitting devices 50. Accordingly, the light emitting devices 50 can be individually driven.

Figure 21:
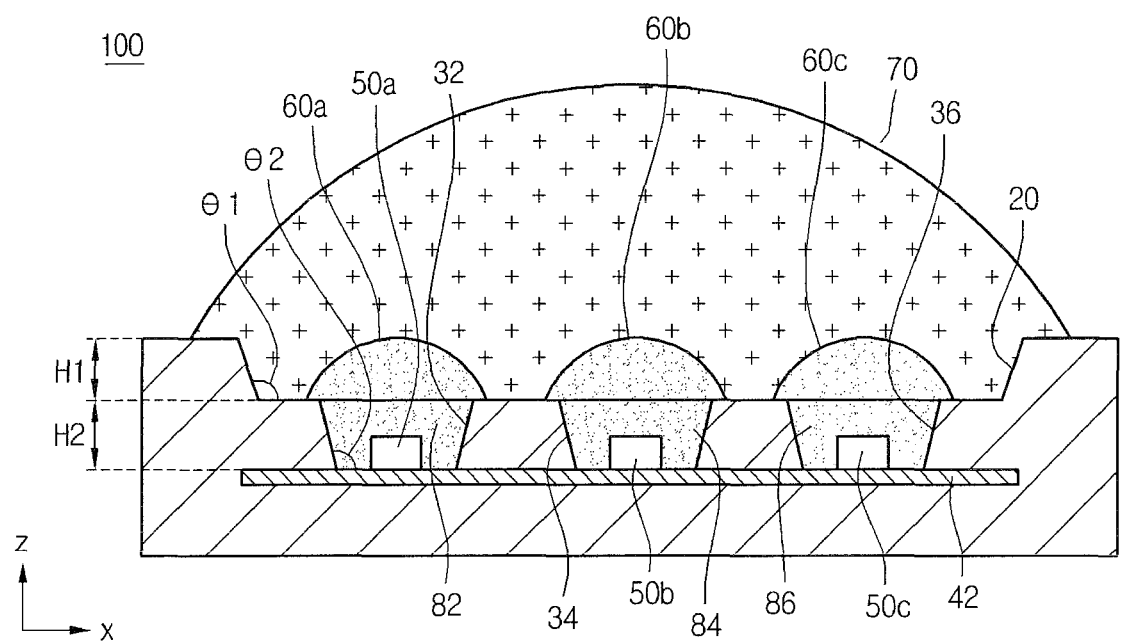
FIG. 21 is a sectional view showing a light emitting device package according to a second embodiment.

Hereinafter, a light emitting device package according to a second embodiment will be described with reference to FIG. 21. FIG. 21 is a sectional view showing a light emitting device package according to the second embodiment.

According to the present embodiment, three receiving parts 32, 34, and 36, three light emitting devices 50a, 50b, and 50c, and three individual lenses 60a, 60b, and 60c are positioned in one recess 20.

Although FIG. 21 shows that the receiving parts 32, 34, and 36 are arranged in one row, the embodiment is not limited thereto. Accordingly, at least four receiving parts may be formed and arranged in a polygonal structure, or arranged in at least two rows.

In this case, the first to third light emitting devices 50a, 50b, and 50c may comprise homogeneous light emitting devices to emit lights having the same wavelengths, or heterogeneous light emitting devices to emit lights having different wavelengths. The first and second resin members 82 and/or the third resin member 86 may comprise homogeneous fluorescence materials or heterogeneous fluorescence materials.

For example, the first to third light emitting devices 50a, 50b, and 50c may emit a blue light, and the first to third resin members 82, 84, and 86 may comprise a yellow fluorescence material.

For another example, the first to third light emitting devices 50a, 50b, and 50c emit a blue light, and the first to third resin members 82, 84, and 86 may comprise blue and red luminescence materials.

For still another example, the first to third light emitting devices 50a, 50b, and 50c emit a blue light, and the first to third resin members 82, 84, and 86 may comprise green, red, yellow fluorescence materials.

For still another example, the first to third light emitting devices 50a, 50b and 50c emit a blue light, and the first to third resin members 82, 84, and 86 may comprise yellow, green, and red fluorescence materials. In this case, the highest light efficiency can be represented in the combination of the first light emitting device 50a and the yellow fluorescence material, and the lowest light efficiency can be represented in the combination of the third light emitting device 50c and the red fluorescence material.

For still another example, the first to third light emitting devices 50a, 50b, and 50c emit a green light, a blue light, and a red light, respectively. In this case, the first and third resin members 82 and 86 may not comprise a fluorescence material, and the second resin member 84 may comprise a yellow fluorescence material. In this case, the highest light efficiency is represented in the first light emitting device 50a, the second highest light efficiency is represented in the combination of the second light emitting device 50b and the yellow fluorescence material, and the lowest light efficiency is represented in the third light emitting device 50c.

For still another example, the first to third light emitting devices 50a, 50b, and 50c emit a UV light. The first to third resin members 82, 84, and 86 may comprise fluorescence materials to emit yellow, green, and red lights, respectively. In this case, the highest light efficiency is represented in the combination of the first light emitting device 50a and the yellow fluorescence material, and the lowest light efficiency is represented in the third light emitting device 50c and the red fluorescence material.

In addition, the light emitting devices and the fluorescence materials may have various combination forms.

Hereinafter, a light emitting device package according to a third embodiment and the modifications thereof will be described with reference to FIGS. 22 to 25.

Figure 22:
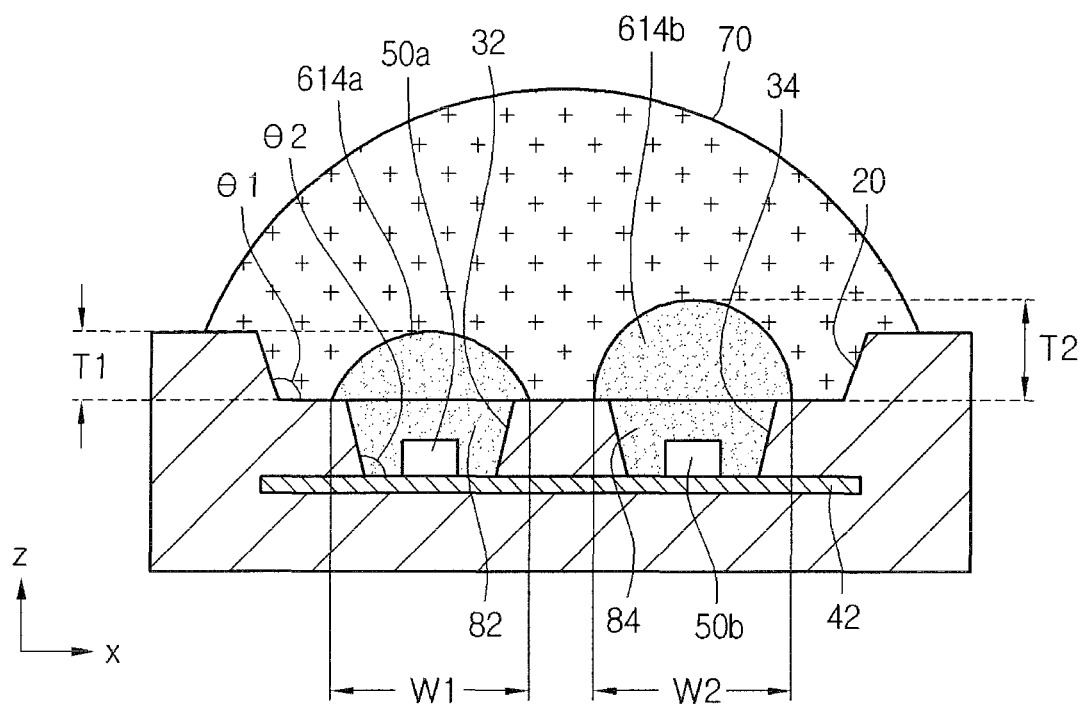
FIG. 22 is a sectional view showing a light emitting device package according to a third embodiment.
Figure 23:
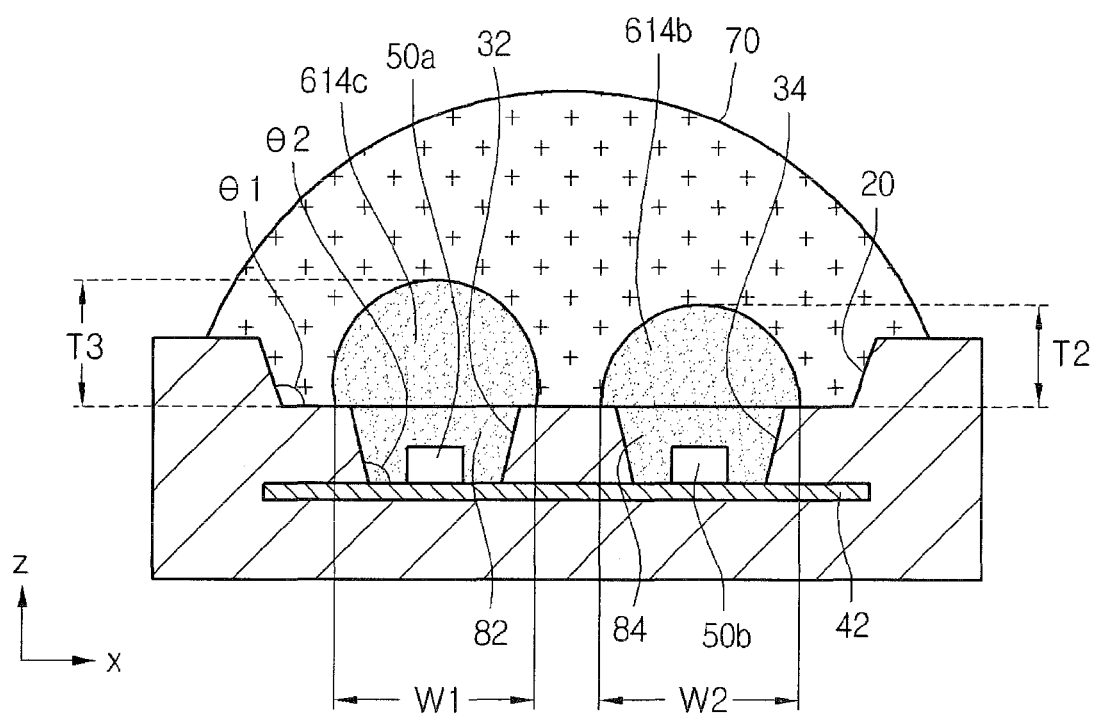
FIG. 23 is a sectional view showing a light emitting device package according to a first modification of the third embodiment.

FIG. 22 is a sectional view showing the light emitting device package according to the third embodiment, and FIG. 23 is a sectional view showing a light emitting device package according to a first modification of the third embodiment.

Referring to FIG. 22, according to the present embodiment, a first individual lens 614a and a second individual lens 614b have different shapes.

For example, the first and second individual lenses 614a and 614b may have different diameters and heights, so that curvatures of the first and second individual lenses 614a and 614b are different from each other. This structure is designed by taking into consideration a fact that the efficiency of the first light emitting device 50a is different from the efficiency of the second light emitting device 50b.

The efficiency of the first light emitting device 50a refers to the efficiency represented by the combination of the first light emitting device 50a and the fluorescence material if the first resin member 32 comprises a fluorescence material, or refers to the efficiency represented by the first light emitting device 50a if the first resin member 32 does not comprise a fluorescence material.

Similarly, the efficiency of the second light emitting device 50b refers to the efficiency represented by the combination of the second light emitting device 50b and a fluorescence material if the second resin member 34 comprise the fluorescence material, or refers to the efficiency represented by the first light emitting device 50b if the second resin member 34 does not comprise a fluorescence material.

According to the present embodiment, the efficiency of the first light emitting device 50a is greater than the efficiency of the second light emitting device 50b. In this case, the shape of the second individual lens 614b corresponding to the second light emitting device 50b is more similar to a hemispherical shape than the shape of the first individual lens 614a corresponding to the first light emitting device 50a is similar to the hemispherical shape.

As described above, since the second individual lens 614b has a shape more similar to a hemispherical shape, the second individual lens 614b represents light efficiency superior to that of the first individual lens 614a. Accordingly, the lower efficiency of the second light emitting device 50b can be enhanced. Therefore, the efficiency difference between the first and second light emitting devices 50a and 50b can be uniformed.

In more detail, since the second individual lens 614b has a substantially hemispherical shape, the ratio of a diameter W2 to a height T2 may be 2:1. In addition, a diameter W1 of the first individual lens 614a is same to the diameter W2 of the second individual lens 614b, and a height T1 of the first individual lens 614a may be lower than the height T2 of the second individual lens 614b. Therefore, the ratio of the diameter W1 to the height T1 of the first individual lens 614a may be greater than 2:1.

In other words, the ratio of the diameter W2 to the height T2 of the second individual lens 614b more approximates 2:1 than the ratio of the diameter W1 to the height T1 of the first individual lens 614a approximates.

Although FIG. 22 shows that the height T1 of the first individual lens 614a is less than the height T2 of the second individual lens 614b, the present embodiment is not limited thereto. Therefore, as shown in FIG. 23, a height T3 of the first individual lens 614c may be greater than the height t2 of the second individual lens 614b. Therefore, the ratio of the width W1 to the height T3 of the first individual lens 614c becomes less than 2:1. Therefore, the diameter W2 to the height T2 of the second individual lens 614b more approximates 2:1 than the ratio of the diameter W1 to the height T3 of the first individual lens 614c approximates.

Therefore, although not shown, individual lenses having light extraction efficiencies different from each other can be provided by changing the widths of the individual lenses.

As described above, according to the present embodiment, since the individual lenses 614a and 614b are formed with respect to the light emitting devices 50a and 50b, respectively, the individual lenses 614a and 614b may have various shapes. Therefore, different characteristics of the light emitting devices 30d and 30k) are compensated, so that a light can be uniformly extracted.

Figure 24:
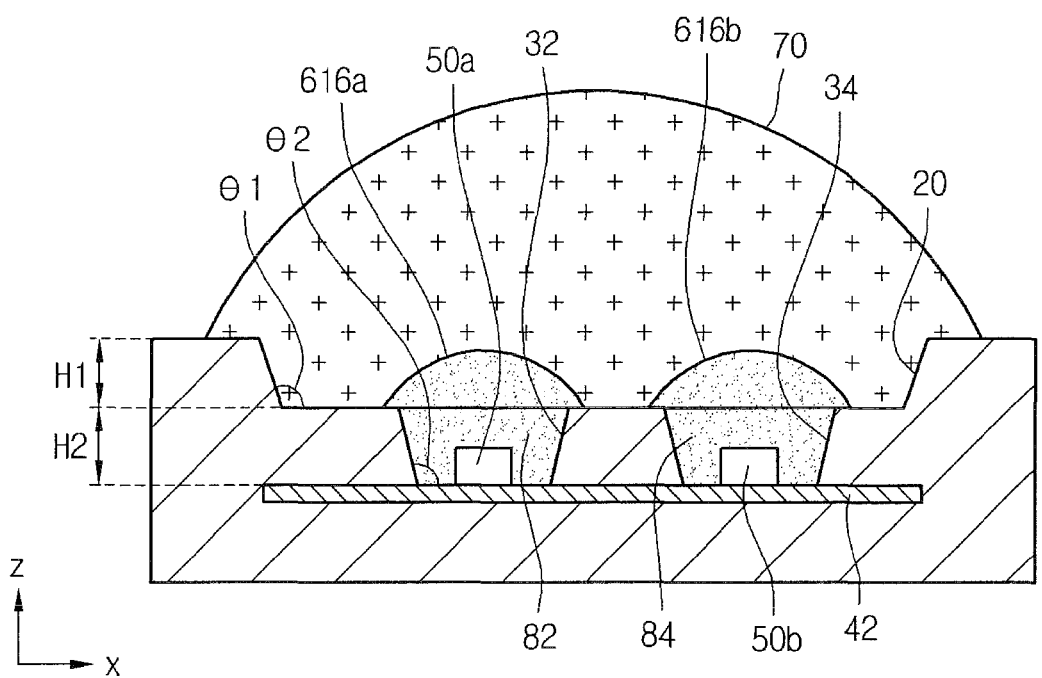
FIG. 24 is a sectional view showing a light emitting device package according to a second modification of the third embodiment.

FIG. 24 is a sectional view showing a light emitting device package according to a second modification of the third embodiment.

According to the present modification, a first individual lens 616a corresponding to the first light emitting device 50a may comprise a material different from a material constituting the second individual lens 616b corresponding to the second light emitting device 50b.

For example, the efficiency of the first light emitting device 50a may be higher than the efficiency of the second light emitting device 50b. In this case, a first individual lens 616a may comprise a material having a refractive index in the range of about 1.4 to about 1.5, and a second individual lens 616b may comprise a material having a refractive index in the range of about 1.5 to about 1.6. The first and second individual lenses 616a and 616b may comprise various materials.

In general, when a lens comprises a material having a refractive index of about 1.5 rather than a material having a refractive index of about 1.4, light efficiency can be more increased. Therefore, the light efficiency of the second individual lens 616b comprising a material having a refractive index of about 1.5 is higher than the light efficiency of the first individual lens 616a. Therefore, the difference in the efficiency between the first and second light emitting devices 50a and 50b can be compensated.

Although a specific refractive index is suggested, the present modification is not limited thereto. In other words, a lens having higher light extraction efficiency is formed on the second light emitting device 50b having lower efficiency, and a lens having lower light extraction efficiency is formed on the first light emitting device 50a having higher light extraction efficiency.

Figure 25:
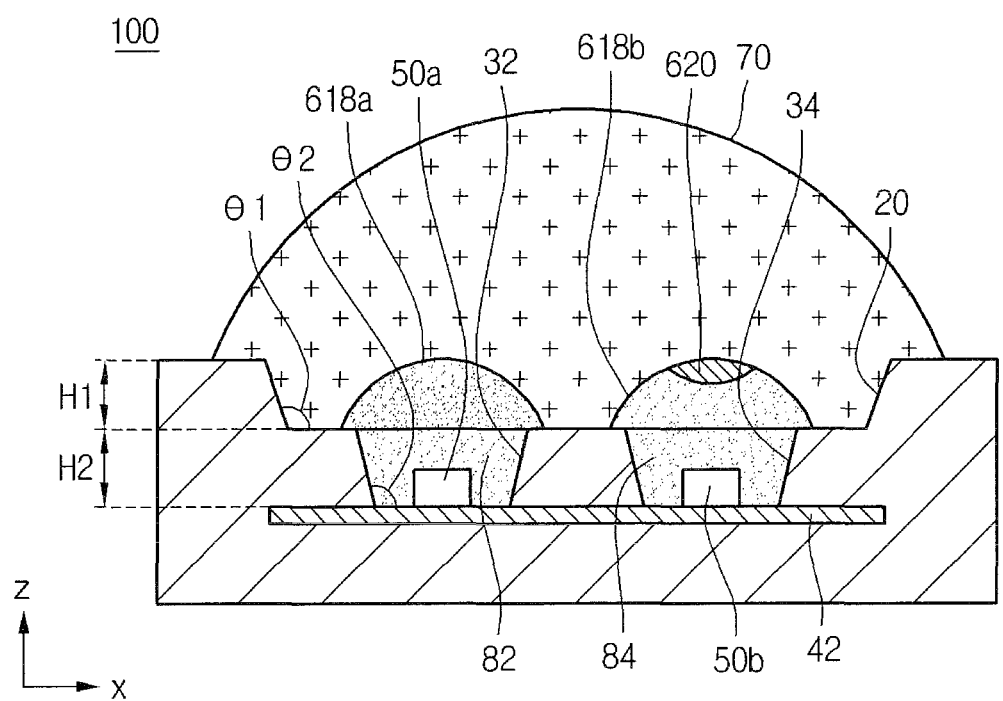
FIG. 25 is a sectional view showing a light emitting device package according to a third modification of the third embodiment.

FIG. 25 is a sectional view showing a light emitting device package according to a third modification of a third embodiment.

Referring to FIG. 25, a first individual lens 618a may comprise a convex lens, and a second individual lens 618b may have an upper portion provided therein with a concave part 618 filled with a reflective material 620. As described above, according to the present modification, the individual lenses 618a and 618b having different structures are used together. The present modification is not limited to the case shown in FIG. 25. Accordingly, the individual lenses 618a and 618b may comprise individual lenses shown in FIGS. 4 to 10.

The light emitting device package according to the embodiments and the modifications may serve as a lighting system such as a backlight unit, an indicator, a lamp or a streetlamp, and the details thereof will be described with reference to FIGS. 26 and 27.

Figure 26:
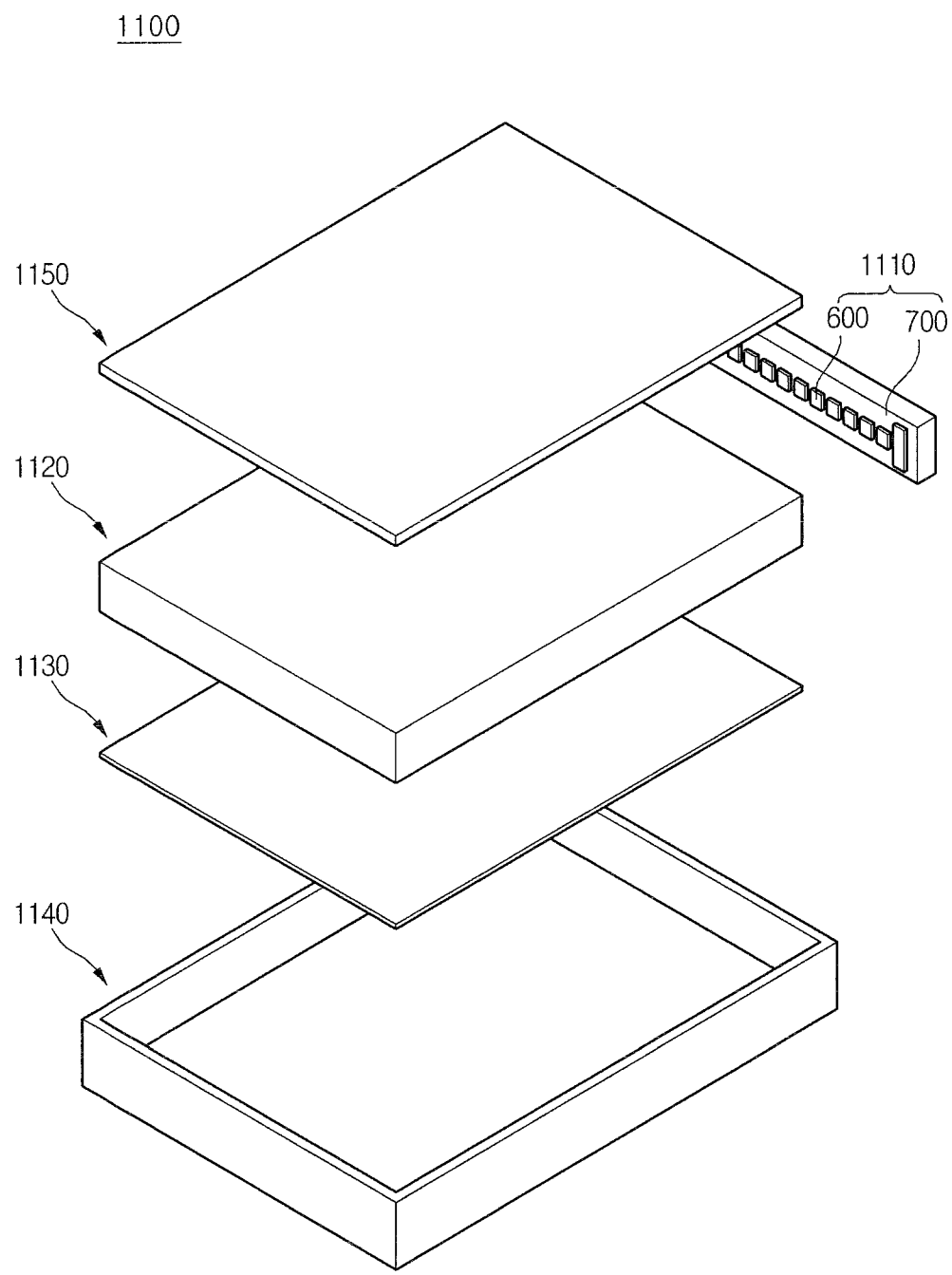
FIG. 26 is a view showing a backlight unit including a light emitting device package according to the embodiment.

FIG. 26 is a perspective view showing a backlight unit 1100 comprising the light emitting device package according to the embodiment. The backlight unit 1100 shown in FIG. 26 is one example of the lighting system, and the embodiment is not limited thereto.

Referring to FIG. 26, the backlight unit 1100 may comprise a bottom cover 1140, a light guide member 1120 provided in the bottom cover 1140, and a light emitting module 1110 provided at one side or on the bottom surface of the light guide member 1120. In addition, a reflective sheet 1130 is disposed below the light guide member 1120.

The bottom cover 1140 has a box shape having an open top surface to receive the light guide member 1120, the light emitting module 1110 and the reflective sheet 1130 therein. In addition, the bottom cover 1140 may comprise metallic material or resin material, but the embodiment is not limited thereto.

The light emitting module 1110 may comprise a plurality of light emitting devices 600 provided on a substrate 700. The light emitting devices 600 provide the light to the light guide member 1120.

As shown in FIG. 22, the light emitting module 1110 is provided on at least one inner side of the bottom cover 1140 to provide the light to at least one side of the light guide member 1120.

In addition, the light emitting module 1110 may be provided under the light guide member 1120 in the bottom cover 1140 to provide the light toward the bottom surface of the light guide member 1120. Such an arrangement can be variously changed according to the design of the backlight unit 1100.

The light guide member 1120 may be provided in the bottom cover 1140. The light guide member 1120 converts the light emitted from the light emitting module 1110 into the surface light to guide the surface light toward a display panel (not shown).

The light guide member 1120 may comprise a light guide plate. For instance, the light guide plate can be manufactured by using acryl-based resin, such as PMMA (polymethyl methacrylate), PET (polyethylene terephthalate), COC, PC (polycarbonate) or PEN (polyethylene naphthalate) resin.

An optical sheet 1150 may be provided above the light guide member 1120.

The optical sheet 1150 may comprise at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be concentrated onto the display panel (not shown) by the light collection sheet. The light output from the light collection sheet is randomly polarized and the brightness enhancement sheet increases the degree of polarization of the light output from the light collection sheet. The light collection sheet may comprise a horizontal and/or vertical prism sheet. In addition, the brightness enhancement sheet may comprise a dual brightness enhancement film and the fluorescent sheet may comprise a transmittive plate or a transmittive film comprising fluorescence materials.

The reflective sheet 1130 may be disposed below the light guide member 1120. The reflective sheet 1130 reflects the light, which is emitted through the bottom surface of the light guide member 1120, toward the light exit surface of the light guide member 1120. The reflective sheet 1130 may comprise resin material having a high reflectance, such as PET, PC or PVC resin, but the embodiment is not limited thereto.

Figure 27:
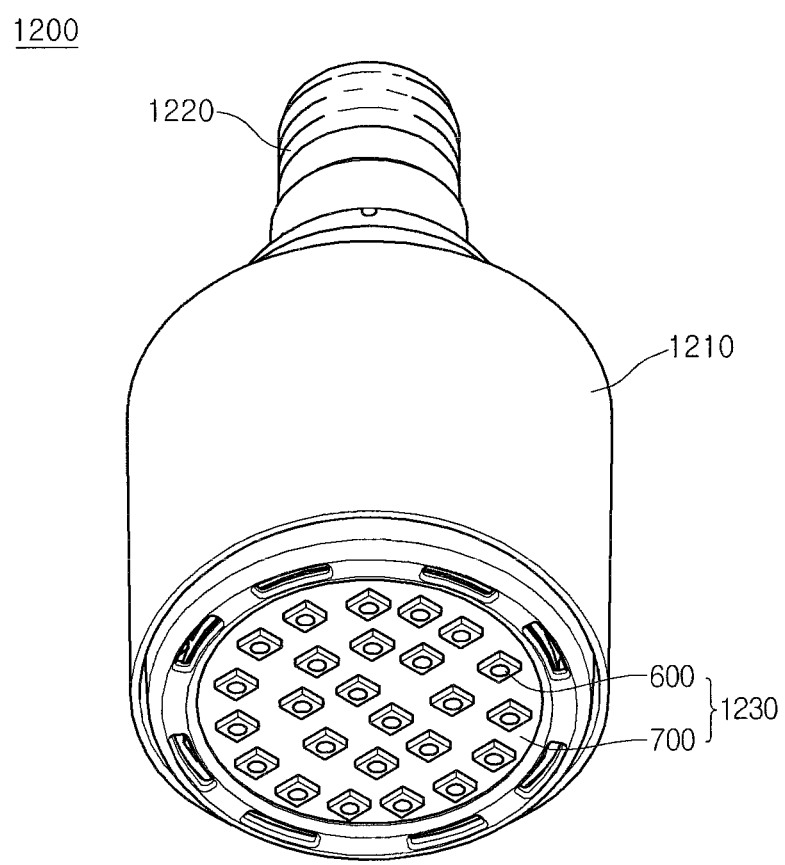
FIG. 27 is a view showing a lighting system including a light emitting device package according to the embodiment.

FIG. 27 is a perspective view showing a lighting system 1200 comprising the light emitting device package according to the embodiment. The lighting system 1200 shown in FIG. 27 is only one example and the embodiment is not limited thereto.

Referring to FIG. 27, the lighting system 1200 may comprise a case body 1210, a light emitting module 1230 provided in the case body 1210, and a connection terminal 1220 provided in the case body 1210 to receive power from an external power source.

Preferably, the case body 1210 may comprise material having superior heat dissipation property. For instance, the case body 1210 may comprise metallic material or resin material.

The light emitting module 1230 may comprise a board 700 and at least one light emitting device 600 provided on the board 700.

The board 700 may comprise an insulating member printed with a circuit pattern. For instance, the board 700 comprises a PCB (printed circuit board), an MC (metal core) PCB, a flexible PCB, or a ceramic PCB.

In addition, the board 700 may comprise material that effectively reflects the light. The surface of the board 700 can be coated with a color, such as a white color or a silver color, to effectively reflect the light.

At least one light emitting device 600 can be provided on the board 700.

Each light emitting device 600 may comprise at least one LED (light emitting diode). The LED may comprise a colored LED that emits the light having the color of red, green, blue or white and a UV (ultraviolet) LED that emits UV light.

The light emitting module 1230 has various combinations of light emitting devices to provide various colors and brightness. For instance, the white LED, the red LED and the green LED can be combined to achieve the high color rendering index (CRI). In addition, a fluorescent sheet may be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may comprise yellow fluorescence material. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 27, the connection terminal 1220 has a shape of a socket screw-coupled with the external power source, but the embodiment is not limited thereto. For instance, the connection terminal 1220 may be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system comprises a light emitting device package capable of improving light efficiency and emitting uniform light, so that superior light efficiency and characteristic can be realized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a body that includes a recess and a plurality of light emitting device receiving parts formed in a bottom surface of the recess;
   a plurality of semiconductor light emitting devices separately positioned in the light emitting device receiving parts;
   a plurality of individual lenses spaced apart from each other on the light emitting device receiving parts;
   a reflective member; and
   a common lens covering the individual lenses,
   wherein at least one of the plurality of individual lenses includes a concave part formed at a portion of an upper surface of the individual lens,
   wherein the concave part is recessed toward the bottom surface of the recess, and
   wherein the reflective member is disposed on an upper surface of the concave part.

2. The light emitting device package of claim 1, wherein the individual lenses are spaced apart from a lateral surface of the recess.

3. The light emitting device package of claim 1, wherein the common lens is positioned on the recess.

4. The light emitting device package of claim 1, wherein the individual lenses have a refractive index greater than a refractive index of the common lens.

5. The light emitting device package of claim 1, further comprising a step formed in the recess to fix the common lens.

6. The light emitting device package of claim 1, wherein the light emitting device receiving part has a depth deeper than a depth of the recess.

7. The light emitting device package of claim 1, wherein the semiconductor light emitting devices comprise first and second semiconductor light emitting devices, and the light emitting device receiving parts comprise a first receiving part to receive the first semiconductor light emitting device and a second receiving part to receive the second semiconductor light emitting device.

8. The light emitting device package of claim 7, wherein at least one of the first receiving part and the second receiving part comprise a fluorescence material.

9. The light emitting device package of claim 8, wherein a fluorescence material contained in the first receiving part is different from a fluorescence material contained in the second receiving part.

10. The light emitting device package of claim 8, wherein a second fluorescence material is provided in the recess above the individual lenses.

11. The light emitting device package of claim 1, further comprising a guide member positioned between the individual lenses to guide the individual lenses.

12. A lighting system comprising:
a board; and
a light emitting module that includes a light emitting device package provided on the board,
wherein the light emitting device package comprises:
a body that includes a recess and a plurality of light emitting device receiving parts fanned in a bottom surface of the recess;
a plurality of semiconductor light emitting devices separately positioned in the light emitting device receiving parts;
a plurality of individual lenses spaced apart from each other on the light emitting device receiving parts;
a reflective member; and
a common lens covering the individual lenses,
wherein at least one of the plurality of individual lenses includes a concave part formed at a portion of an upper surface of the individual lens,
wherein the concave part is recessed toward the bottom surface of the recess, and
wherein the reflective member is disposed on an upper surface of the concave part.

13. The lighting system of claim 12, wherein the individual lenses have a refractive index greater than a refractive index of the common lens.

14. The lighting system of claim 12, wherein the semiconductor light emitting devices comprise first and second light emitting devices, and the light emitting device receiving parts comprise a first receiving part to receive the first light emitting device and a second receiving part to receive the second light emitting device.

15. The lighting system of claim 12, wherein the individual lenses are spaced apart from a lateral surface of the recess.

16. A light emitting device package comprising:
a body that includes a recess and a plurality of light emitting device receiving parts formed in a bottom surface of the recess;
a plurality of semiconductor light emitting devices separately positioned in the light emitting device receiving parts;
a plurality of individual lenses spaced apart from each other on the light emitting device receiving parts;
a reflective member; and
a common lens to cover the individual lenses,
wherein an upper surface of at least one of the plurality of individual lenses includes at least two points of inflection, and
wherein the reflective member is disposed on a portion between the at least two points of inflection.

17. The light emitting device package of claim 16, wherein the plurality of individual lenses has a refractive index greater than a refractive index of the common lens.

18. The light emitting device package of claim 1, wherein the reflective member includes an organic material and an inorganic material.

19. The light emitting device package of claim 12, wherein the reflective member includes an organic material and an inorganic material.

20. The light emitting device package of claim 16, wherein the reflective member includes an organic material and an inorganic material.

* * * * *